US006636444B2

(12) United States Patent
Uchida et al.

(10) Patent No.: US 6,636,444 B2
(45) Date of Patent: Oct. 21, 2003

(54) SEMICONDUCTOR MEMORY DEVICE HAVING IMPROVED DATA TRANSFER RATE WITHOUT PROVIDING A REGISTER FOR HOLDING WRITE DATA

(75) Inventors: Toshiya Uchida, Kawasaki (JP); Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/057,976

(22) Filed: Jan. 29, 2002

(65) Prior Publication Data

US 2002/0105842 A1 Aug. 8, 2002

Related U.S. Application Data

(62) Division of application No. 09/644,547, filed on Aug. 24, 2000, now Pat. No. 6,359,813.

(30) Foreign Application Priority Data

Nov. 22, 1999  (JP) ............................................ 11-331524

(51) Int. Cl.[7] .............................................. G11C 16/04
(52) U.S. Cl. ............................ 365/189.05; 365/189.01; 365/189.07; 365/189.12; 365/194
(58) Field of Search .......................... 365/194, 189.05, 365/189.01, 189.07, 189.12

(56) References Cited

U.S. PATENT DOCUMENTS

| 5,321,651 A | 6/1994 | Monk .................... 365/189.01 |
| 6,144,616 A | 11/2000 | Suzuki et al. ................ 365/233 |
| 6,147,919 A | 11/2000 | Kawabata et al. ........... 365/208 |

FOREIGN PATENT DOCUMENTS

JP         2001135082 A   *  5/2001   ......... G11C/11/407

\* cited by examiner

Primary Examiner—Van Thu Nguyen
(74) Attorney, Agent, or Firm—Arent Fox Kintner Plotkin & Kahn

(57) ABSTRACT

A semiconductor memory device has a read data line, a write data line, a data holding circuit, and a data writing circuit. The data holding circuit holds data on the write data line, and the data writing circuit writes the data held on the write data line into a memory cell. Further, a semiconductor memory device has a read data line, a write data line, and an address information holding circuit. The address information holding circuit holds address information that is input in relation to write data, and when an access occurs to the address held in the address information holding circuit, data held on the write data line is written into a memory cell corresponding to the address.

2 Claims, 28 Drawing Sheets

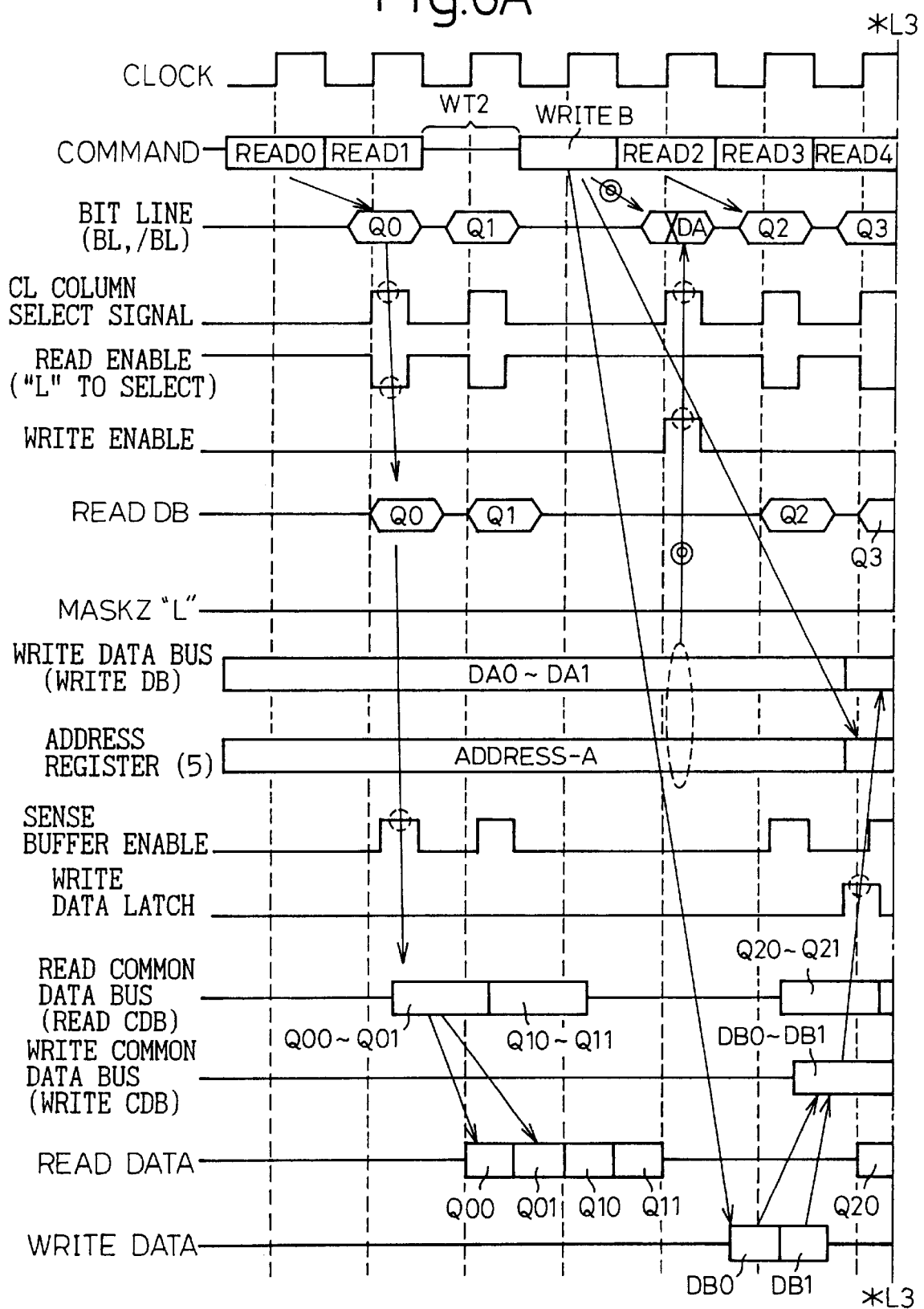

SEMICONDUCTOR MEMORY DEVICE HAVING IMPROVED DATA TRANSFER RATE WITHOUT PROVIDING A REGISTER FOR HOLDING WRITE DATA

This is a Division of application Ser. No. 09/644,547 filed Aug. 24, 2000 now U.S. Pat. No. 6,359,813. The disclosure of the prior application is hereby incorporated by reference herein in its entirety.

BACKGROUND OF THE INVENTION

1. Field of the Invention

The present invention relates to a semiconductor memory device and, more particularly, to a semiconductor memory device which employs a delayed write (also called late write) technique.

2. Description of the Related Art

Recently, the performance of components used to construct computers and other information processing apparatuses has improved greatly and, with these improvements, there has developed a need to increase the operating speed and data transfer rate of semiconductor memory devices such as synchronous dynamic random access memories (SDRAMs). To improve the data transfer rate, it is essential to increase the efficiency of bus utilization, and a technique called delayed write is proposed as one method of achieving this.

However, the semiconductor memory device employing the delayed write technique offers the effect of increasing the data transfer rate, but requires the provision of a data register for holding write data and an address register for holding the write data address.

In recent semiconductor memory devices, with increasing data transfer rate, the data bus width has been increasing and this, coupled with the development of DDR (Double Data Rate) technology, causes the amount of data that can be written in a single write operation to become larger than ever before. Accordingly, the provision of registers, required when employing the above-described delayed write technique, not only leads to increased chip area but also becomes a factor that increases the cost.

The above problem is not limited to SDRAMs or DDR DRAMs, but is also an issue with various other semiconductor memory devices such as direct Rambus DRAMs and non-DRAM devices such as SRAMs (Static Random Access Memories).

The prior art and its associated problem will be described in detail later with reference to accompanying drawings.

SUMMARY OF THE INVENTION

An object of the present invention is to provide a semiconductor memory device in which data transfer rate is increased without having to provide a register for holding write data.

According to the present invention, there is provided a semiconductor memory device, having a read data line and a write data line, comprising a data writing circuit and a data holding circuit included in the data writing circuit, the data holding circuit holding write data on the write data line until inputting the next write command.

The semiconductor memory device may further comprise a sense amplifier/write switch, including a sense amplifier section, connected to the read data line, for reading data from the memory cell, and a write switch section, connected to the write data line, for writing data into the memory cell. The sense amplifier/write switch may be provided within a memory core, and the read data line and the write data line may be separated from each other within the memory core. The semiconductor memory device may further comprises a write amplifier driving the write data line, the write amplifier outputting write data on the write data line and holding the write data.

The semiconductor memory device may further comprise a mask information holding section for receiving mask information indicating enable/disable of the write data, and for holding the mask information therein. The mask information may be input together with the write data. The mask information holding section may be provided within a write amplifier which drives the write data line. The semiconductor memory device may further comprise an open condition control section for controlling the write data line to an open condition when disabling the write data.

The write data line may be constructed as complementary signal lines, and the semiconductor memory device may include an equal potential control section for controlling the complementary signal lines to equal potentials when disabling the write data. The mask information held in the mask information holding section may be supplied to the sense amplifier/write switch, and a write control to the memory cell may be carried out based on the mask information. The mask information held in the mask information holding section may be supplied to a decoder provided within the memory core, and a write control to the memory cell may be carried out based on the mask information.

The decoder, in which the write control is carried out based on the mask information, may be a column decoder. A write amplifier, which outputs write data on the write data line and holds the write data, may control the enable/disable of the write data held in the write amplifier, in accordance with the mask information and a data disable signal.

The mask information holding section may disable the write data held in the write amplifier, in accordance with the data disable signal, when the write data held on the write data line is written to the memory cell. The semiconductor memory device may be a dynamic memory, and the data disable signal may be issued in connection with a refresh operation of the dynamic memory. The data may be write data that is input in accordance with a write command; the data holding circuit may hold first write data that is input in accordance with a first write command; and the data writing circuit may write the first write data into the memory cell when a second write command to be input following the first write command is input.

Further, according to the present invention, there is provided a semiconductor memory device having a read data line and a write data line, comprising an address information holding circuit holding address information that is input in relation to write data, and wherein, when an access occurs to the address held in the address information holding circuit, data held on the write data line is written into a memory cell corresponding to the address.

The semiconductor memory device may further comprise a write amplifier outputting write data on the write data line, and holding the write data; an address comparator comparing received address information with the address information held in the address information holding circuit; and a data selector selecting the data output from the memory cell or the data output from the write amplifier, based on the result of the comparison supplied from the address comparator. The data selector may select the data output from the memory cell or the data output from the write amplifier, based on mask information indicating enable/disable of the write data.

The semiconductor memory device may further comprise a write amplifier outputting write data on the write data line, and holding the write data; and an address comparator comparing received address information with the address information held in the address information holding circuit, wherein based on the result of the comparison supplied from the address comparator, the data held on the write data line may be written into the memory cell. Based on the result of the comparison supplied from the address comparator, the data held on the write data line may be written into the memory cell, while at the same time, the data is transferred onto the read data line.

BRIEF DESCRIPTION OF THE DRAWINGS

The present invention will be more clearly understood from the description of the preferred embodiments as set forth below with reference to the accompanying drawings, wherein:

FIGS. 6A and 6B are timing diagrams for explaining one example of operation of the first embodiment of the semiconductor memory device according to the present invention;

DESCRIPTION OF THE PREFERRED EMBODIMENTS

Before proceeding to the detailed description of the preferred embodiments of the semiconductor memory device according to the present invention, the related art semiconductor memory device and the problem associated with the prior art operation thereof will be described with reference to drawings.

Figure 1A:
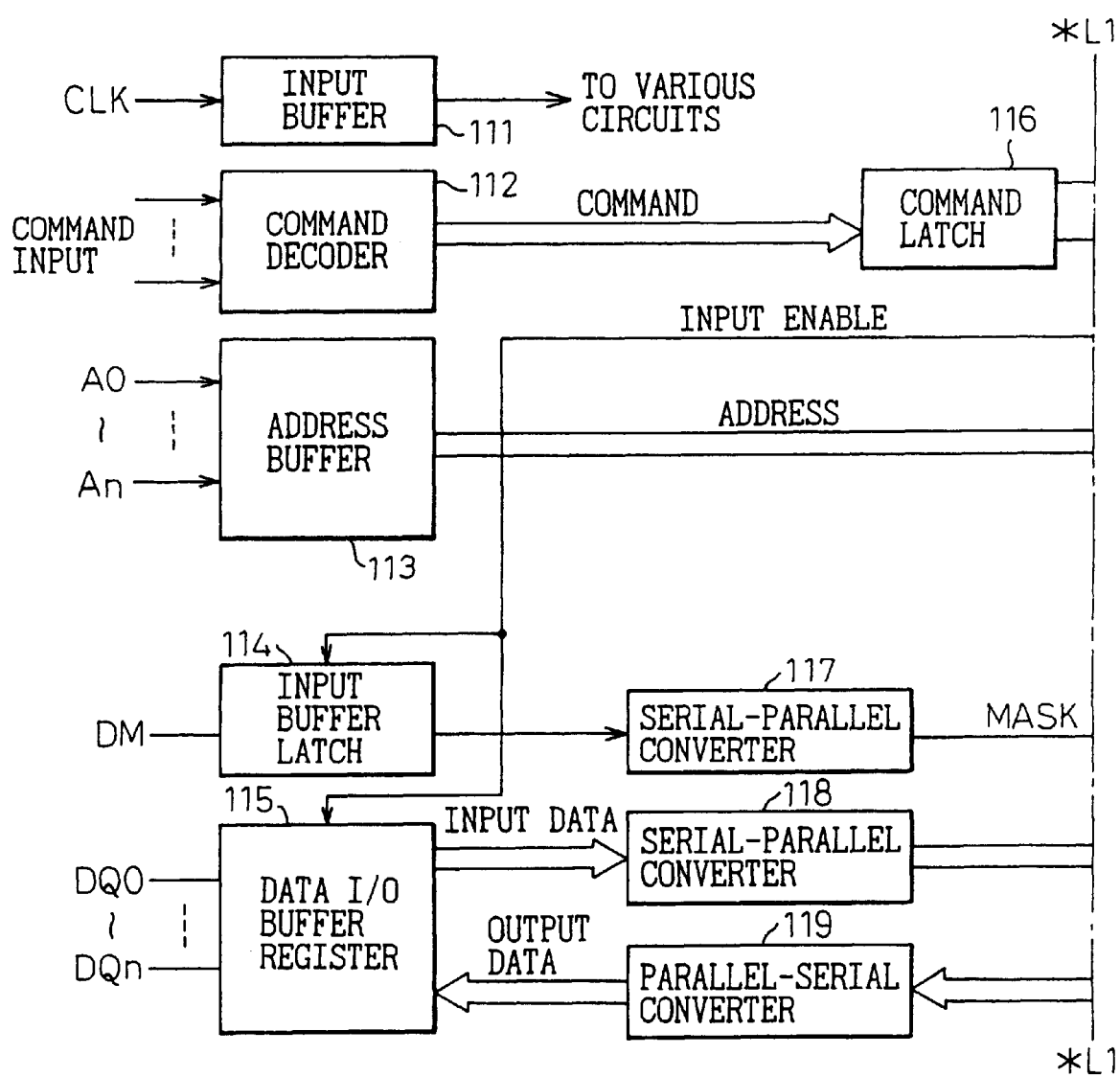
FIGS. 1A and 1B are block diagrams showing one configuration example of a related art semiconductor memory device.
Figure 1B:
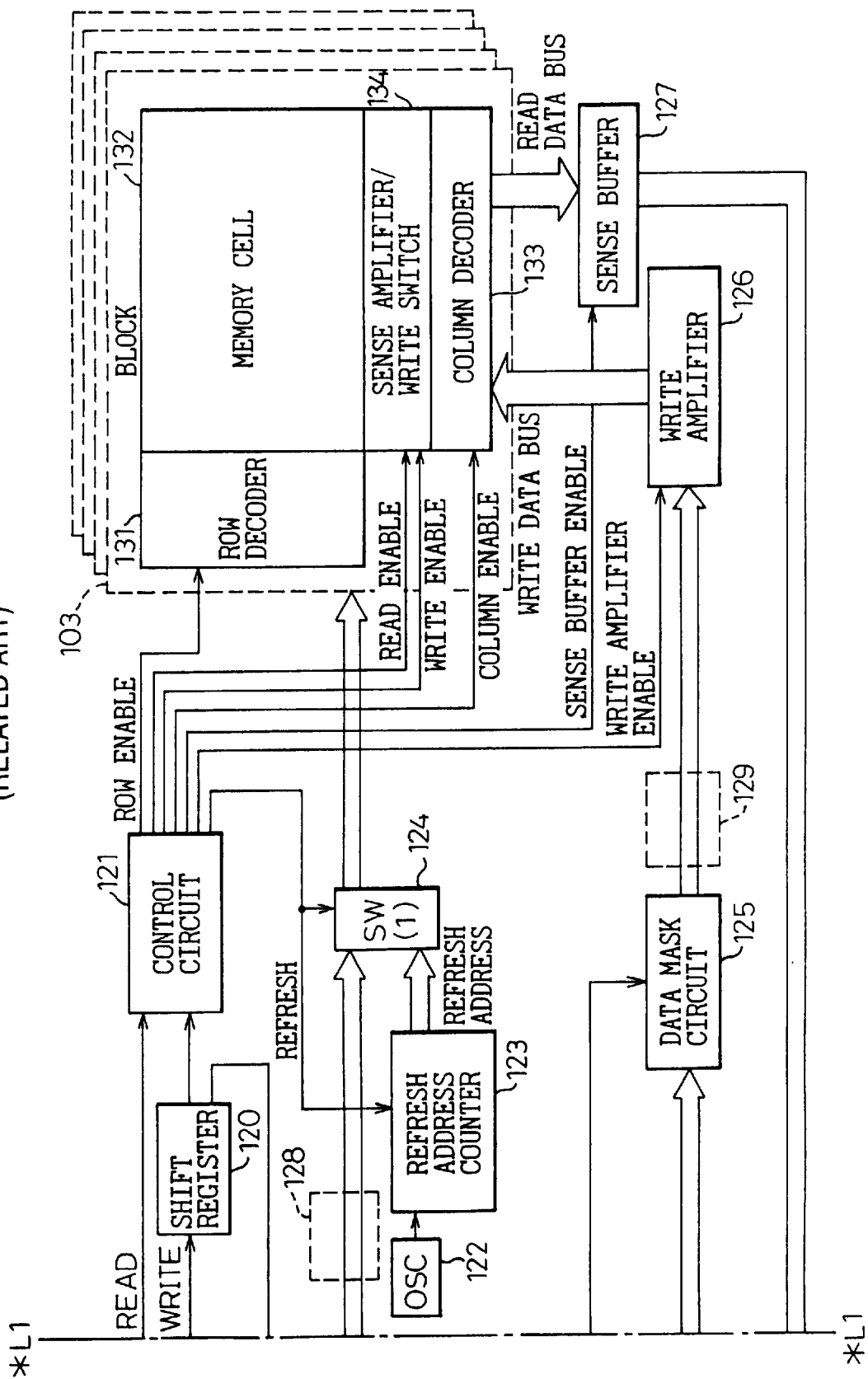

FIGS. 1A and 1B are block diagrams showing one configuration example of a related art semiconductor memory device; an example of an SDRAM is shown here in schematic form. Note that the semiconductor memory device shown in FIGS. 1A and 1B is not published and is considered as a related art (not prior art).

In FIGS. 1A and 1B, reference numeral 111 is an input buffer, 112 is a command decoder, 113 is an address buffer, 114 is an input buffer latch, 115 is a data I/O buffer register, 116 is a command latch, 117 and 118 are serial-parallel converters, 119 is a parallel-serial converter, 120 is a shift register, and 121 is a control circuit. Further, reference numeral 122 is an oscillator (OSC), 123 is a refresh address counter, 124 is a switch, 125 is a data mask circuit, 126 is a write amplifier, 127 is a sense buffer, 128 is an address register, and 129 is a data register.

The input buffer 111 buffers an externally supplied clock CLK and delivers it to various circuits, while the command decoder 112 decodes an externally supplied command and delivers the decoded command to the control circuit 121, input buffer latch 114, and data I/O buffer register 115 via the command latch 116 and shift register 120. The intervention of the shift register 120 is needed, for example, when the write latency is 2 or larger (write latency$\geq$2, e.g. the case of FIG. 3 described later), but is not needed when the write latency is 0 or 1 (write latency=0 or 1).

The control circuit 121 controls each memory block 103 in a memory core by supplying an enable signal in accordance with a decoded read or write command (READ, WRITE). Each memory block 103 includes a row decoder 131 which controls word lines (WL) in a memory cell (memory cell array) 132 in accordance with a row address, a column decoder 133 which controls columns (bit lines BL and /BL) in accordance with a column address, and a sense amplifier/write switch 134 which performs read/write control; with these elements controlled by row enable, column enable, and read/write enable signals supplied from the control circuit 121, read/write operations are performed to the memory cell 132.

An output (refresh control signal) of the control circuit 121 is supplied to the refresh address counter 123 and the address selector switch 124, and normal operation (read/write operation) and refresh operation are controlled by switching the address between an external address supplied via the address buffer and an internal address generated for refresh operation (the refresh address generated using the oscillator 122). Here, write data is input to the memory core (memory block 103) via the write amplifier 126, while read data is output from the memory core via the sense buffer 127.

The data I/O buffer register 115 performs processing for the input/output of write data supplied from the outside and read data output from the memory cell 132. In a write operation, write data DQ0 to DQn is supplied to the write amplifier 126 via the serial-parallel converter 118 which performs serial-to-parallel data conversion. In a read operation, read data output from the sense buffer 127 is transferred to the data I/O buffer register 115 via the parallel-serial converter 119 which performs parallel-to-serial data conversion, and the read data is output externally (on an external data bus). Here, mask signal data DM is input from the outside, for example, together with the write data DQ0 to DQn, and supplied as a mask signal MASK to the data mask circuit 125 via the input buffer latch 114 and serial-parallel converter 117. With this signal, control is performed to mask the associated write data. The mask signal MASK may be supplied from the outside by means of an address code or the like, for example, as part of a write command signal.

When employing, for example, a delayed write technique as will be described later with reference to FIG. 4, the semiconductor memory device of FIGS. 1A and 1B requires the provision of an address register 128 for holding a write address and a data register 129 for holding write data. Note that the data register 129 is provided only one set on a semiconductor chip.

Figure 2:
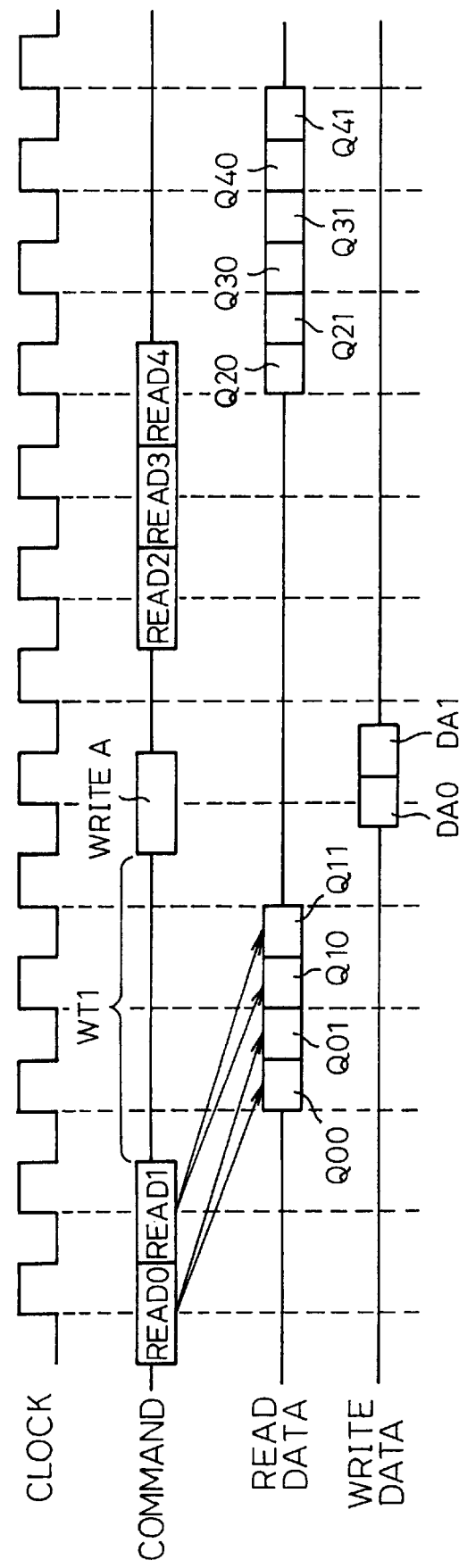
FIG. 2 is a timing diagram (part 1) for explaining the prior art operation of the semiconductor memory device.
Figure 3:
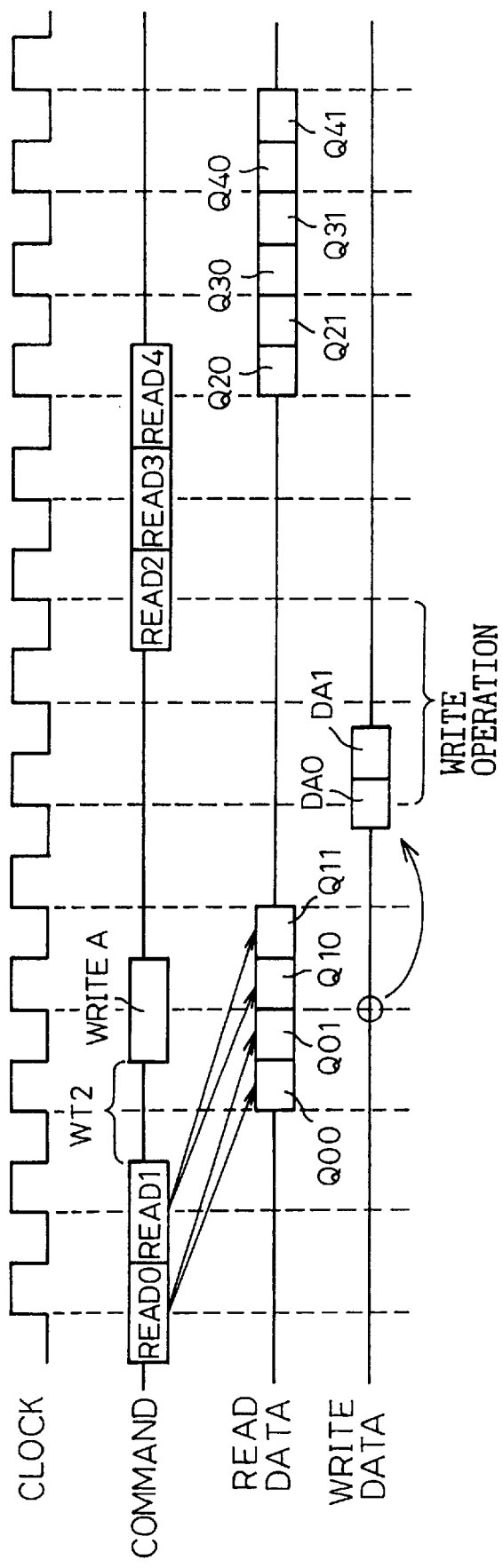
FIG. 3 is a timing diagram (part 2) for explaining the prior art operation of the semiconductor memory device.
Figure 4:
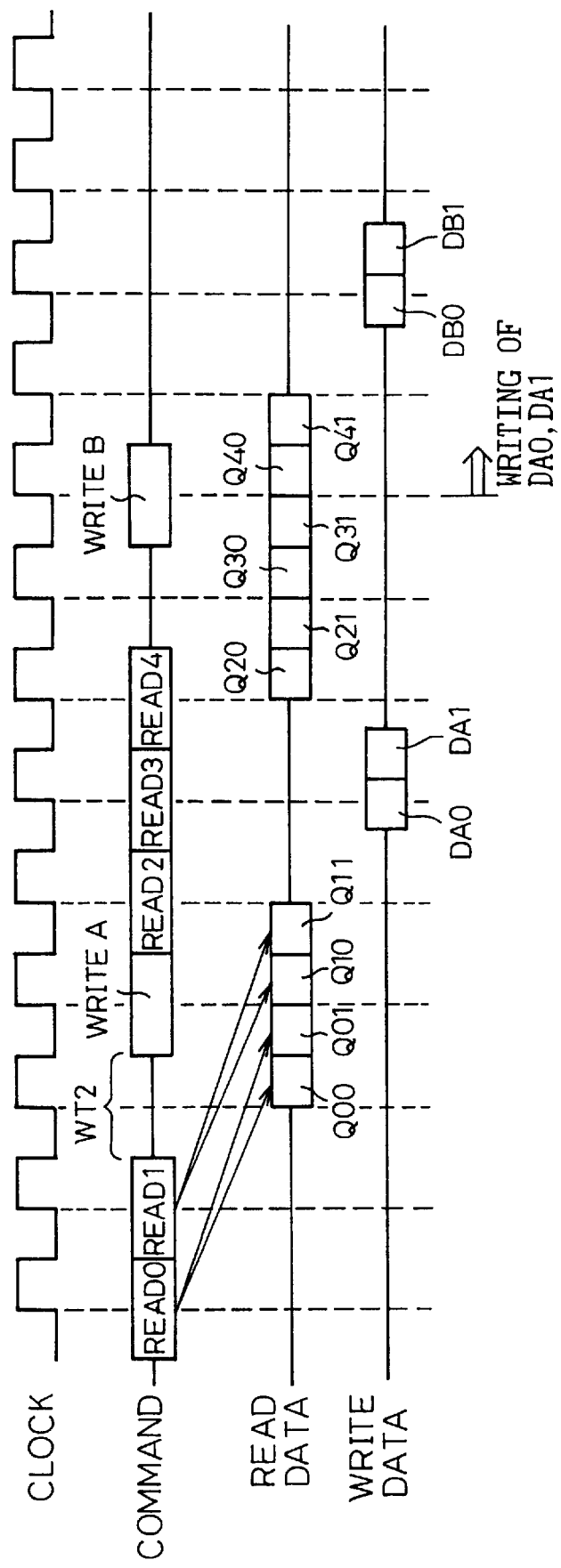
FIG. 4 is a timing diagram (part 3) for explaining the prior art operation of the semiconductor memory device.

FIGS. 2 to 4 are diagrams for explaining the prior art operation of the semiconductor memory device: FIG. 2 shows the operation of a conventional SDRAM with read latency=2 and write latency=0, FIG. 3 illustrates the operation of an SDRAM with read latency=write latency=2, and FIG. 4 depicts the operation of an SDRAM employing the technique of delayed write. Note that the semiconductor memory device of FIGS. 1A and 1B is not a prior art, but is a related art. Nevertheless, the operation shown in FIGS. 2 to 4 is already published and is considered as a prior art.

As shown in FIG. 2, the conventional SDRAM has a read latency of 2 and a write latency of 0; when external read commands, READ0 and READ1, are input, read data Q00, Q01 and Q10, Q11 are output two clocks later. The read data Q00, Q01 is associated with the read command READ0, while the read data Q10, Q11 is associated with the read command READ1. When performing a write operation (WRITE A) following the read operations (READ0 and READ1), since the write latency is 0, write data DA0, DA1 is supplied at the same time that the write command (WRITE A) is input.

In the conventional SDRAM such as shown in FIG. 2, since the external write data DA0, DA1 is supplied after the data Q00, Q01 and Q10, Q11 read out by the read commands READ0 and READ1 are output, the write command WRITE A cannot be input until after a time interval WT1 has elapsed from the time that the immediately preceding read command READ1 was input; accordingly, this time interval WT1 is wasted, degrading the data transfer rate (the efficiency of data bus utilization). Here, the time that the data DA0, DA1 is actually written to the memory cell by the write command WRITE A is, for example, two clocks after the command WRITE A is input.

On the other hand, in the case of the SDRAM with read latency=write latency=2, since the write data DA0, DA1 need only be supplied two clocks after the write command WRITE A is input, that is, since the write command WRITE A can be input two clocks earlier than the write data DA0, as shown in FIG. 3, the time interval WT2 between the write command WRITE A and the immediately preceding read command READ1 can be substantially reduced compared with the case of the SDRAM shown in FIG. 2 (which requires the time interval WT1). This contributes to increasing the data transfer rate (the efficiency of data bus utilization), for example, in cases where write commands are input consecutively; however, when the write command WRITE A is followed by another read command READ2, as shown in FIG. 3, the timing for latching the data DA0, DA1 by the write command WRITE A becomes the same as that in the conventional SDRAM of FIG. 2 and, as a result, the timing for outputting the data (Q20, Q21) read out by the next read command READ2 also becomes the same as that in the SDRAM of FIG. 2, and the expected increase in the data transfer rate cannot be achieved.

As noted earlier, when the write latency is 2 as in the SDRAM of FIG. 3, a shift register (120) for shifting the write command (WRITE) by one clock must be provided. The mechanism with read latency=write latency=2 as shown in FIG. 3 may sometimes be called delayed write (or late write), but in this case, depending on conditions (for example, when read operations are performed alternately with write operations), the data transfer rate cannot be increased, though there is no need to provide the registers (address register 128 and data register 129) required in the SDRAM of FIG. 4 described hereinafter.

As shown in FIG. 4, in the SDRAM employing the delayed write technique, the time interval between the write command WRITE A and the immediately preceding read command READ1 can be reduced to WT2 as in the case of FIG. 3 described above. In the SDRAM employing the delayed write technique shown here, the write data DA0, DA1 associated with the write command WRITE A is written when the next write command (WRITE B) is input. To accomplish this, the write data DA0, DA1 associated with the previous write command WRITE A must be held in a register (data register 129) and its write address must also be held in a register (address register 128) until the next write command (WRITE B) is input.

More specifically, the SDRAM employing the delayed write technique includes registers (129 and 128) for holding (storing) write data and its associated address; in operation, when the write command (WRITE A) is input, the write data (DA0, DA1) and its address are temporarily stored in the respective registers, and when there occurs a gap between read commands or when the next write command (WRITE B) is input, writing is done by retrieving the write data (DA0, DA1) and its address from the respective registers. This arrangement allows a read command (READ2) to be input immediately following the write command (WRITE A), and thus the efficiency of data bus utilization can be greatly enhanced.

As described above, the semiconductor memory device (SDRAM) employing the delayed write technique such as shown in FIG. 4 offers the effect of increasing the data transfer rate, but requires the provision of the data register (129) for holding write data and the address register (128) for holding the write data address.

In recent semiconductor memory devices, with increasing data transfer rate, the data bus width has been increasing (e.g., to 64-bit width) and, this coupled with the development of DDR (Double Data Rate) technology in which data are input continuously and serially and are converted internally into parallel data to enable the data to be written at one time, the amount of data that can be written in a single write operation is becoming larger than ever before. Accordingly, the provision of the registers (especially, the data register 129 for temporarily storing write data) required when employing the above-described delayed write technique not only leads to increased chip area but also becomes a factor that increases the cost.

The above problem is not limited to SDRAMs or DDR DRAMs, but is also an issue with various other semiconductor memory devices such as direct Rambus DRAMs and non-DRAM devices such as SRAMs (Static Random Access Memories).

The preferred embodiments of the semiconductor memory device of the present invention will be described in detail below with reference to drawings.

Figure 5A:
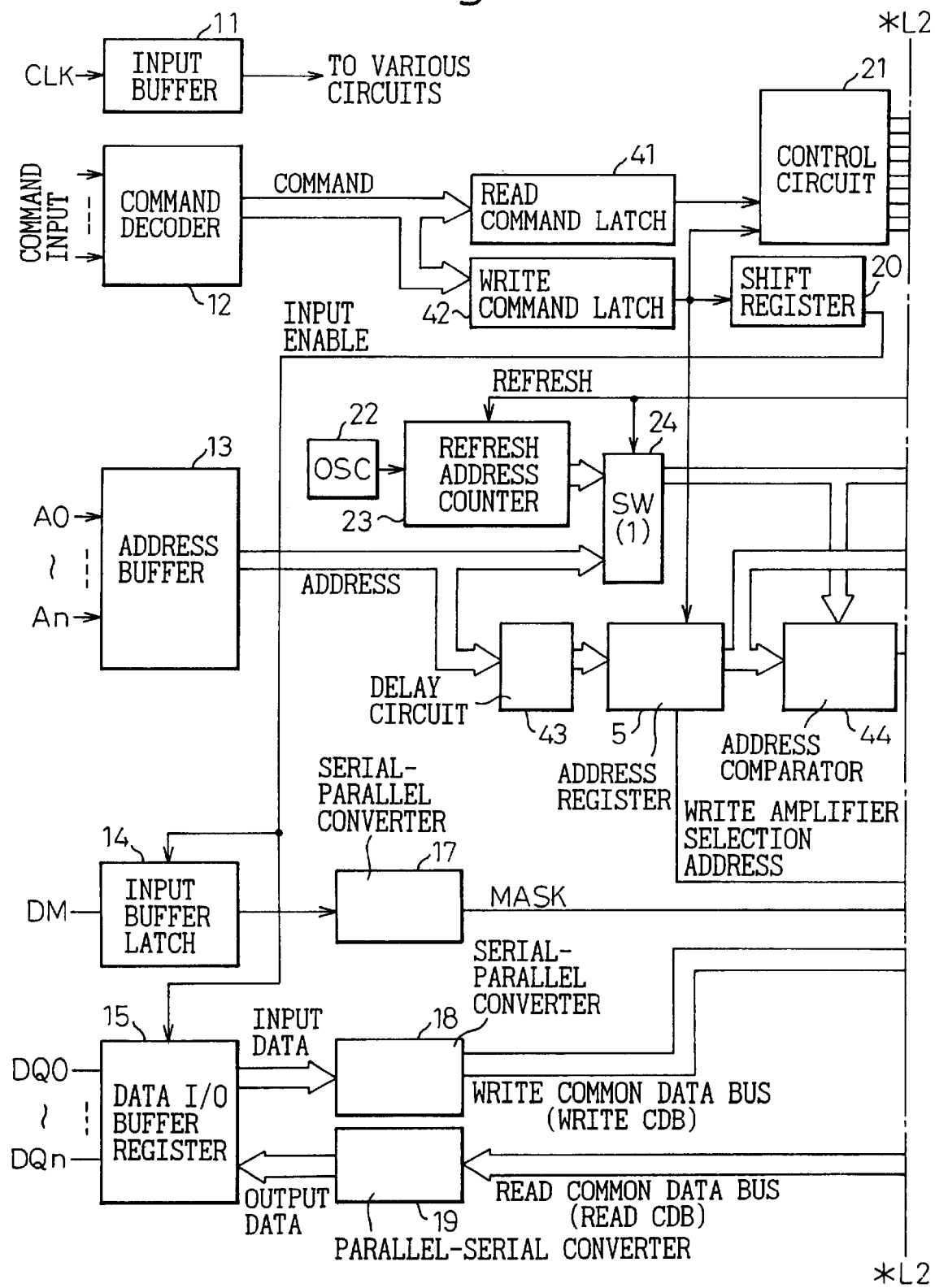
FIGS. 5A and 5B are block diagrams showing a first embodiment of a semiconductor memory device according to the present invention.
Figure 5B:
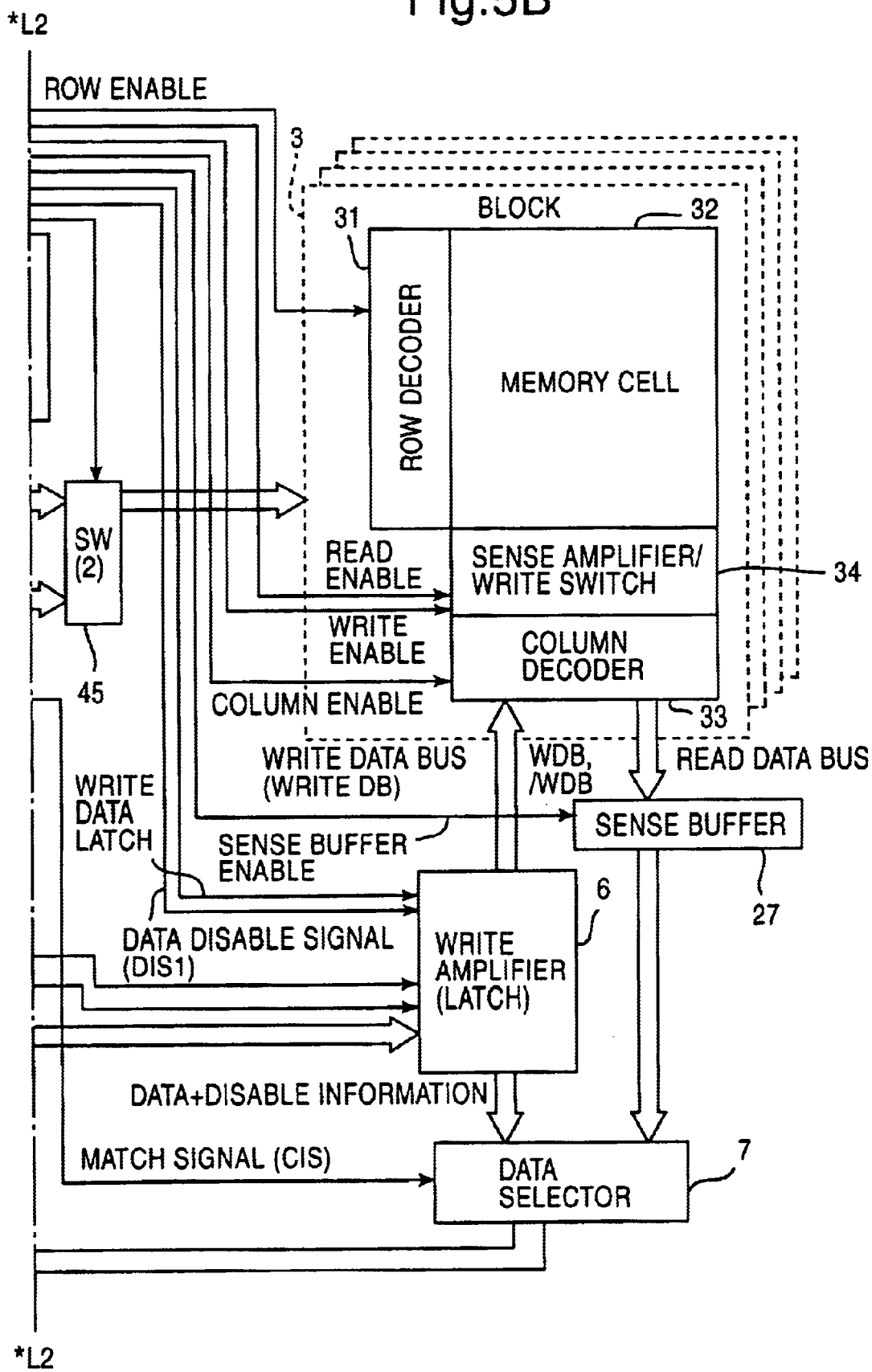

FIGS. 5A and 5B are block diagrams showing a first embodiment of the semiconductor memory device according to the present invention; an example of an SDRAM is shown here in schematic form. In FIGS. 5A and 5B, reference numeral 11 is an input buffer, 12 is a command decoder, 13 is an address buffer, 14 is an input buffer latch, 15 is a data I/O buffer register, 17 and 18 are serial-parallel converters, 19 is a parallel-serial converter, 20 is a shift register, and 21 is a control circuit. Further, reference numeral 22 is an oscillator (OSC), 23 is a refresh address counter, 24 is a switch, 27 is a sense buffer, 29 is a data register, 41 is a read command latch, 42 is a write command latch, 43 is a delay circuit, 44 is an address comparator, and 45 is a switch. Further, reference numeral 5 is an address register, 6 is a write amplifier, 7 is a data selector, 3 is a memory block (memory core), 31 is a row decoder, 32 is a memory cell (memory cell array), 33 is a column decoder, and 34 is a sense amplifier/write switch.

The input buffer 11 buffers an externally supplied clock CLK and delivers it to various circuits, while the command decoder 12 decodes an externally supplied command and delivers a read command to the read command latch 41 and a write command to the write command latch 42. Here, the output of the read command latch 41 is fed to the control circuit 21, while the output of the write command latch 42 is supplied to the shift register 20 and the address register 5 as well as to the control circuit 21. The output of the shift register 20 is supplied as an input enable signal to the input buffer latch 14 and the data I/O buffer register 15.

The control circuit 21 controls each memory block in the memory core by supplying an enable signal in accordance with the input read or write command. Each memory block 3 includes a row decoder 31 which controls word lines (WL) in the memory cell (memory cell array) 32 in accordance with a row address, a column decoder 33 which controls columns (bit lines BL and /BL) in accordance with a column address, and a sense amplifier/write switch 34 which performs read/write control; with these elements controlled by row enable, column enable, and read/write enable signals supplied from the control circuit 21, read/write operations are performed to the memory cell 32.

An output (refresh control signal) of the control circuit 21 is supplied to the refresh address counter 23 and the address selector switch 24, and a normal operation (read/write operation) and a refresh operation are controlled by switching the address between an external address supplied via the address buffer 13 and an internal address generated for refresh operation (the refresh address, i.e., the output of the refresh address counter 23, generated using the oscillator 22). Here, write data is input into the memory core (block 3) via the write amplifier (latch) 6, while read data is output from the memory core via the sense buffer 27 and data selector 7. The operation of the write amplifier 6, etc. which constitute the feature of the first embodiment, will be described in detail later.

The data I/O buffer register 15 performs processing for the input/output of write data supplied from the outside and read data output from the memory cell 32. In a write operation, write data DQ0 to DQn is supplied to the write amplifier 6 via the serial-parallel converter 18 which performs serial-to-parallel data conversion. In a read operation, read data output from the data selector 7 is transferred to the data I/O buffer register 15 via the parallel-serial converter 19 which performs parallel-to-serial data conversion, and the read data is output externally (on an external data bus). Here, mask signal data DM is input from the outside, for example, together with the write data DQ0 to DQn, and supplied as a mask signal MASK to the write amplifier 6 via the input buffer latch 14 and serial-parallel converter 17. The mask signal MASK may be supplied from the outside by means of an address code or the like, for example, as part of a write command signal.

As described above, in the semiconductor memory device of the related art, as shown in FIGS. 1A and 1B, the data register 129 is provided only one set on the semiconductor chip. On the other hand, in the semiconductor memory device of the first embodiment according to the present invention, as shown in FIGS. 5A and 5B, a plurality of write amplifiers (latches) 6 are provided on the semiconductor chip, and the specific write amplifier selected by an address input holds write data until inputting the next write command.

As shown in FIGS. 5A and 5B, in the first embodiment, the address input with the write command is held in the address register 5, while the data (write data) associated with the write command is transferred to the write amplifier 6 and held on a data write bus. The delay circuit 43 preceding the address register 5 has the function of delaying the address timing by an amount of time equal to the write latency before the address is input to the register 5. The write command is input to the control circuit 21 without the intervention of the shift register 20, while the input enable signal to be supplied to the input buffer latch 14 and the data I/O buffer register 15 is generated through the shift register 20. This is because, when the write command is input, a write operation to the memory cell 32 is immediately carried out using the address held in the address register 5 and the data held on the write data bus (WRITE DB) and, after that, the next write data is latched.

Here, mask-related signals which frequently appear in the description given herein will be described briefly below. First, the mask signal MASK is one that is generated from the signal DM supplied from the outside together with the write data DQ0 to DQn, but as earlier stated, this mask signal may be supplied from the outside, for example, as part of a write command. Data disable signals DIS1 and DIS2 are signals by which the control circuit 21 instructs the write amplifier 6 to disable the write data. Data disabled state signals MASKX and MASKZ are signals by which the write data is disabled in accordance with the mask signal MASK and the data disable signal DIS1 or DIS2. Here, the data disabled state signals MASKX and MASKZ are complementary signals; for example, and MASKX is at a low level "L" and MASKZ at a high level "H" to disable the data.

Figure 6B:
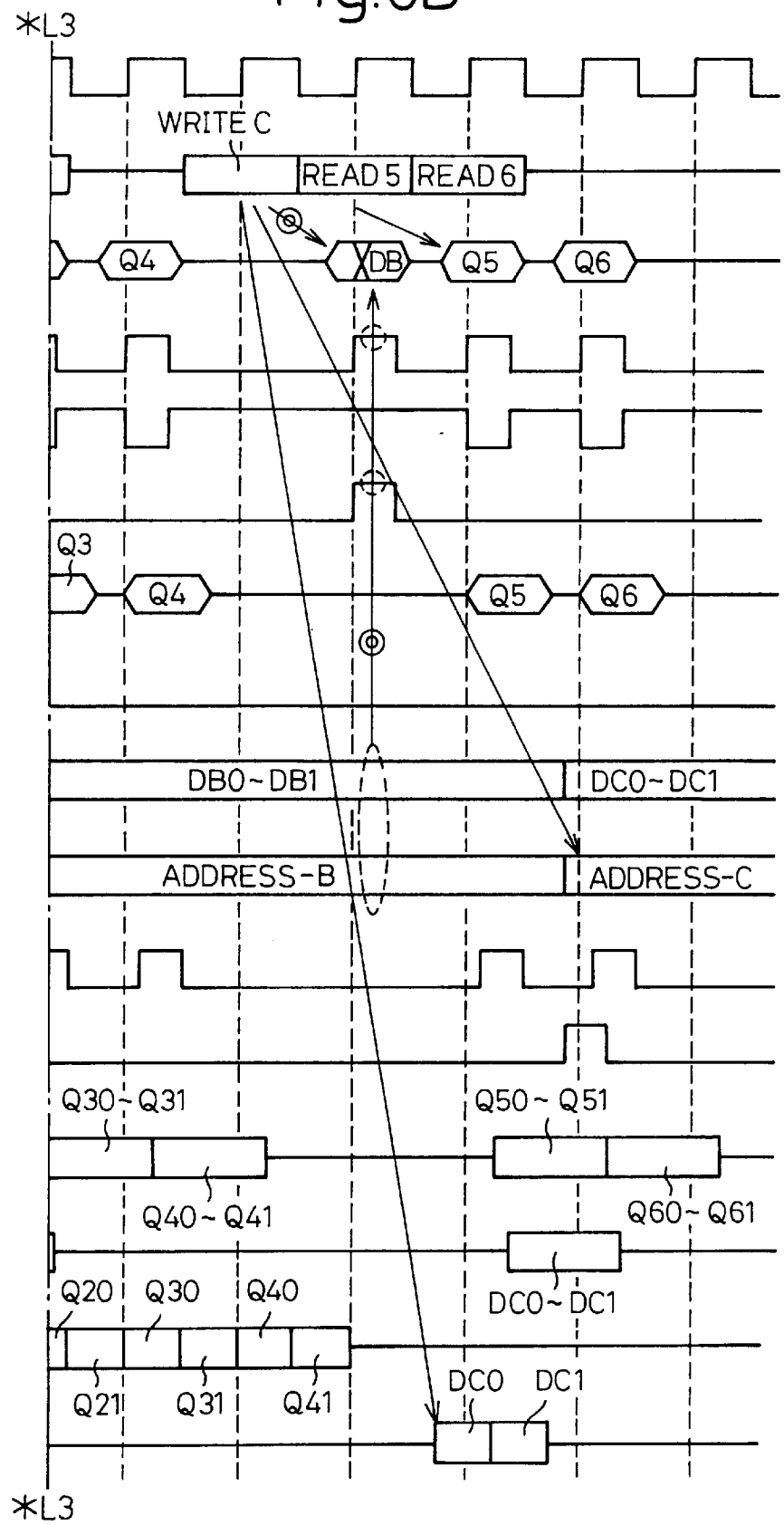

FIGS. 6A and 6B are timing diagrams for explaining one example of the operation of the first embodiment of the semiconductor memory device according to the present invention; in the example shown, write operations are interspersed among read operations.

As shown in FIGS. 6A and 6B, when a read command READ0 is input from the outside, data Q0 corresponding to bit lines BL and /BL is read out, and this read data is transferred from a read data bus to a read common data bus (READ CDB) via the sense buffer 27 and data selector 7, and is output as read data Q00 and Q01 via the parallel-serial converter 19 and data I/O buffer register 15. In this embodiment, the read latency is 2.

When a write command WRITE B is input from the outside following the read commands READ0 and READ1 (after the time interval WT2 has elapsed), writing to the memory cell (32) (bit lines BL, /BL: DA) is done using the information "ADDRESS-A" held in the address register (5) and "DA0 to DA1" (associated with the previous write command (WRITE A: not shown)) held on the write data bus (WRITE DB). Then, the write data (DB0 to DB1) associated with the newly input write command WRITE B and the mask signal MASK (DMB0, DMB1) are transferred to the write amplifier 6 for holding therein.

More specifically, the write data (DB0 to DB1) input from the outside is transferred onto a write common data bus (WRITE CDB) via the data I/O buffer register 15 and serial-parallel converter 18, and supplied to the write amplifier 6. On the other hand, the mask signal input from the outside is supplied as mask data MASK (DMB0, DMB1) to the write amplifier 6 via the input buffer latch 14 and serial-parallel converter 17. At this time, the data are also held on the write data bus (WRITE DB) connecting between the write amplifier 6 and the column decoder 33. On the other hand, the address (ADDRESS-B) associated with the write command WRITE B is stored in the address register 5.

After that, read commands READ2, READ3, and READ4 are input successively, as shown in FIGS. 6A and 6B. Then, when a write command WRITE C is input, writing to the memory cell 32 (bit lines BL, /BL: DB) is done using the ADDRESS-B associated with the previous write command WRITE B and held in the address register 5 and the information (write data DB0 to DB1 and mask data DMB0, DMB1) associated with the previous write command WRITE B and held on the write data bus (WRITE DB). Specific circuit examples of the address register 5, the write amplifier 6, etc. will be described in detail later with reference to the drawing.

Figure 7A:
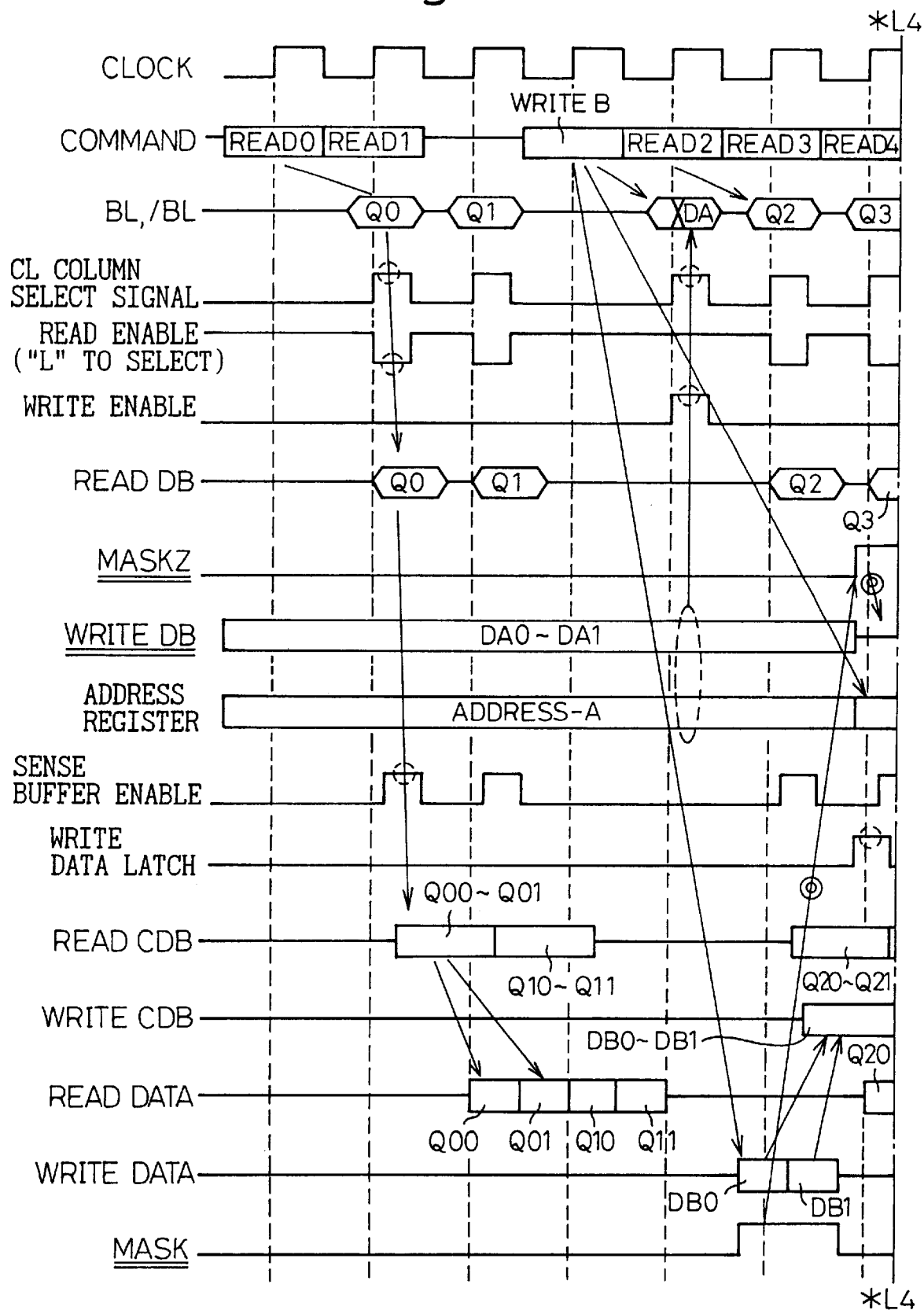
FIGS. 7A and 7B are timing diagrams for explaining another example of operation of the first embodiment of the semiconductor memory device according to the present invention.
Figure 7B:
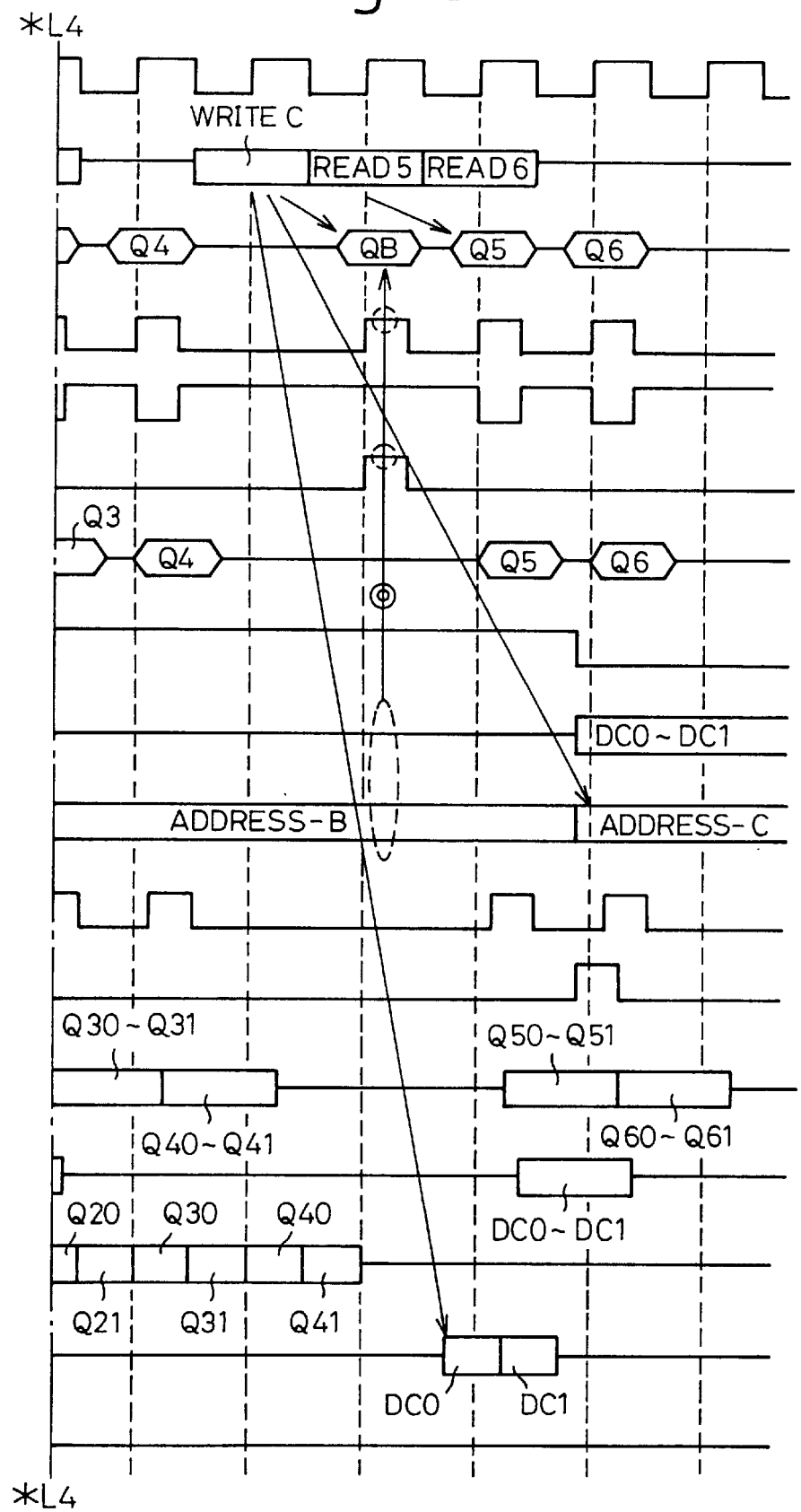

FIGS. 7A and 7B are timing diagrams for explaining another example of operation of the first embodiment of the semiconductor memory device according to the present invention; this example deals with the case in which the write command WRITE B in the operation shown in FIGS. 6A and 6B is applied with a mask.

As shown in FIGS. 7A and 7B, when the write command WRITE B is applied with a mask, the mask signal MASK goes to the high level "H" when the write data DB0, DB1 associated with the write command WRITE B is input and, in response to that, the data disabled state signal MASKZ goes to the high level "H" to disable the write data DB0, DB1, as a result of which the write data bus (WRITE DB) is held at an intermediate level. That is, when the next write command WRITE C is input, writing to the memory cell is not performed, but only data originally held in the memory cell designated by the address ADDRESS-B appears on the bit lines BL and /BL and rewriting with the write data DB0, DB1 is not done. In the case of the write data DB0 and DB1 associated with the write command WRITE B, for example, mask control may be performed by applying a mask signal to each of the write data items DB0 and DB1.

Figure 8A:
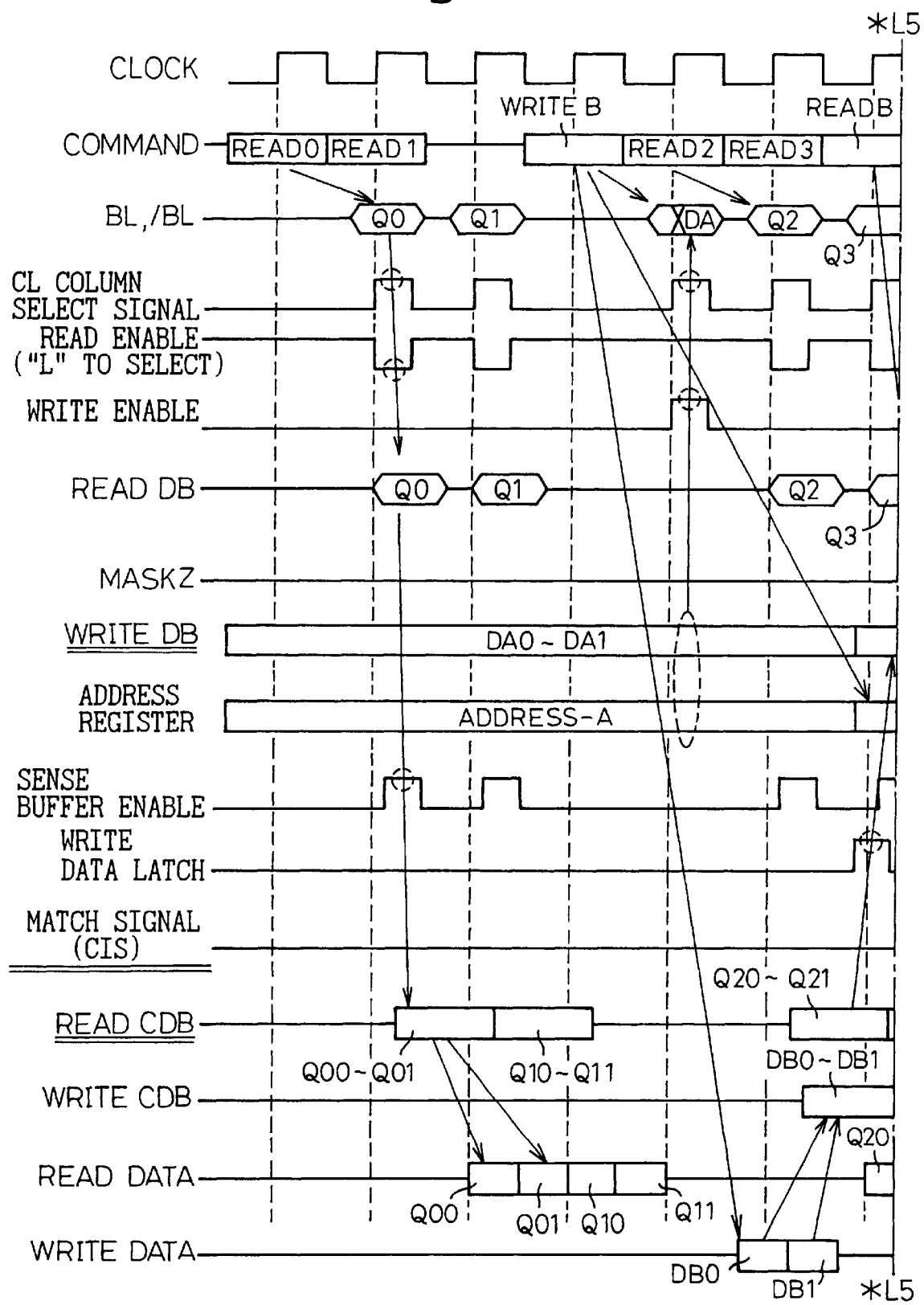
FIGS. 8A and 8B are timing diagrams for explaining still another example of operation of the first embodiment of the semiconductor memory device according to the present invention.
Figure 8B:
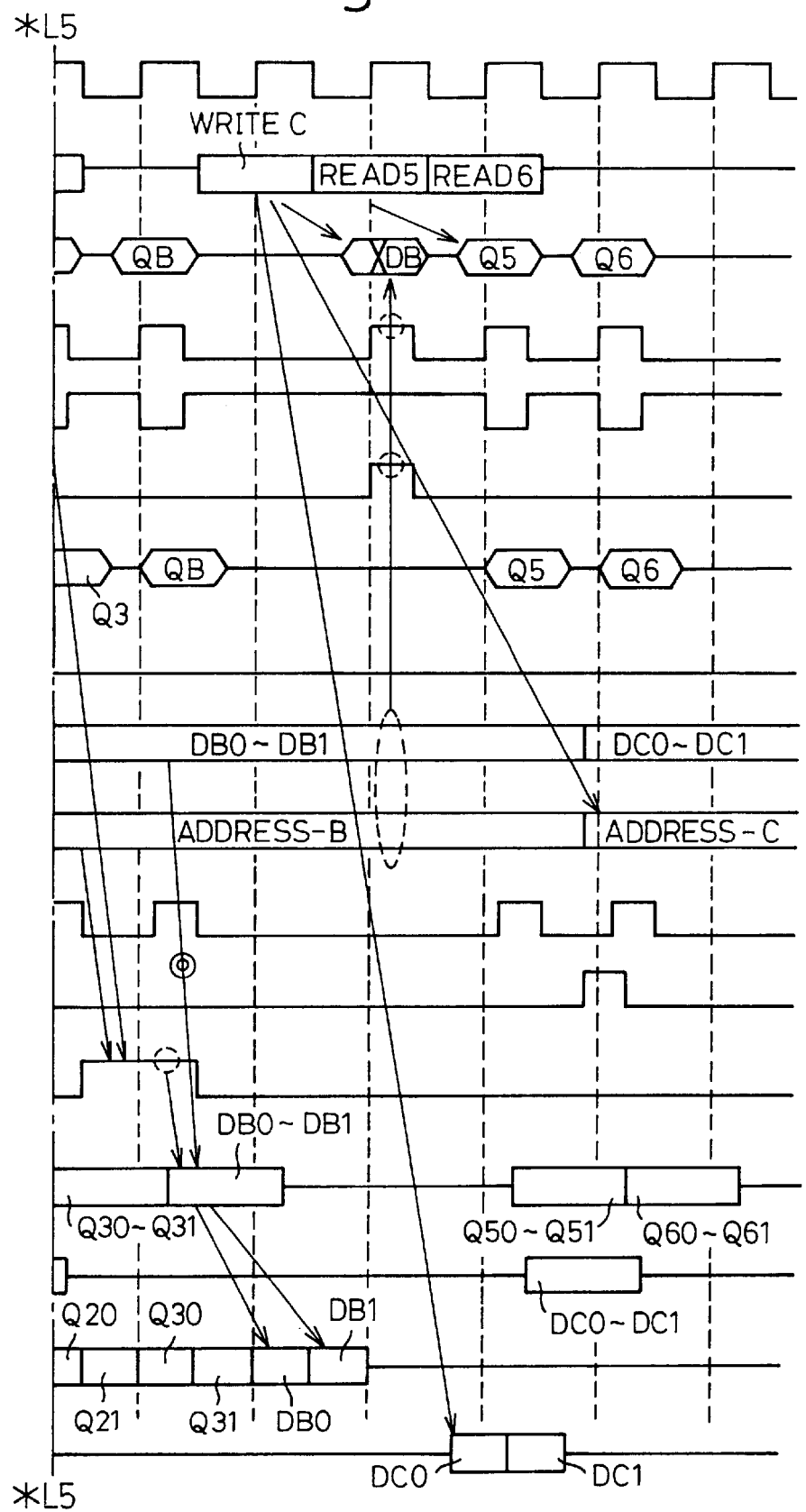

FIGS. 8A and 8B are timing diagrams for explaining still another example of operation of the first embodiment of the semiconductor memory device according to the present invention; this example deals with the case in which, when data yet to be written is held on the write data bus and its address held in the address register, a read command for that address is input.

As shown in FIGS. 8A and 8B, when read commands READ2 and READ3 are input following the write command WRITE B and then a read command READ B (a read command for data at the same address as the address specified by the write command WRITE B) is input, the address comparator 44 outputs a match signal CIS (a pulse of high level "H"), in response to which the data selector 7 transfers the data held in the write amplifier 6 directly to the output circuit (parallel-serial converter 19). The data held on the write data bus (WRITE DB) is written to the memory cell 32 when the next write command WRITE C is thereafter input. Here, if the write data is masked, the data selector 7 selects the data from the memory cell 32 (the output of the sense buffer 27) for transfer to the output circuit in accordance with the disable information (mask information) from the write amplifier 6. On the other hand, when only part (DB1) of the write data (DB0 and DB1) is masked, data (QB1) read from the memory cell 32 may be selected for the data corresponding to the masked address and data (DB0) held in the write amplifier 6 for the data corresponding to the non-masked address, thus outputting the data DB0 and QB1 in response to the read command READ B.

In the description of each of the embodiments given herein, the semiconductor memory device is shown by omitting the bank and block concept, but it should be noted that an actual semiconductor memory device (SDRAM) comprises, for example, a plurality of banks (for example, four banks) each consisting of a plurality of blocks (for example, four or eight blocks).

Figure 9:
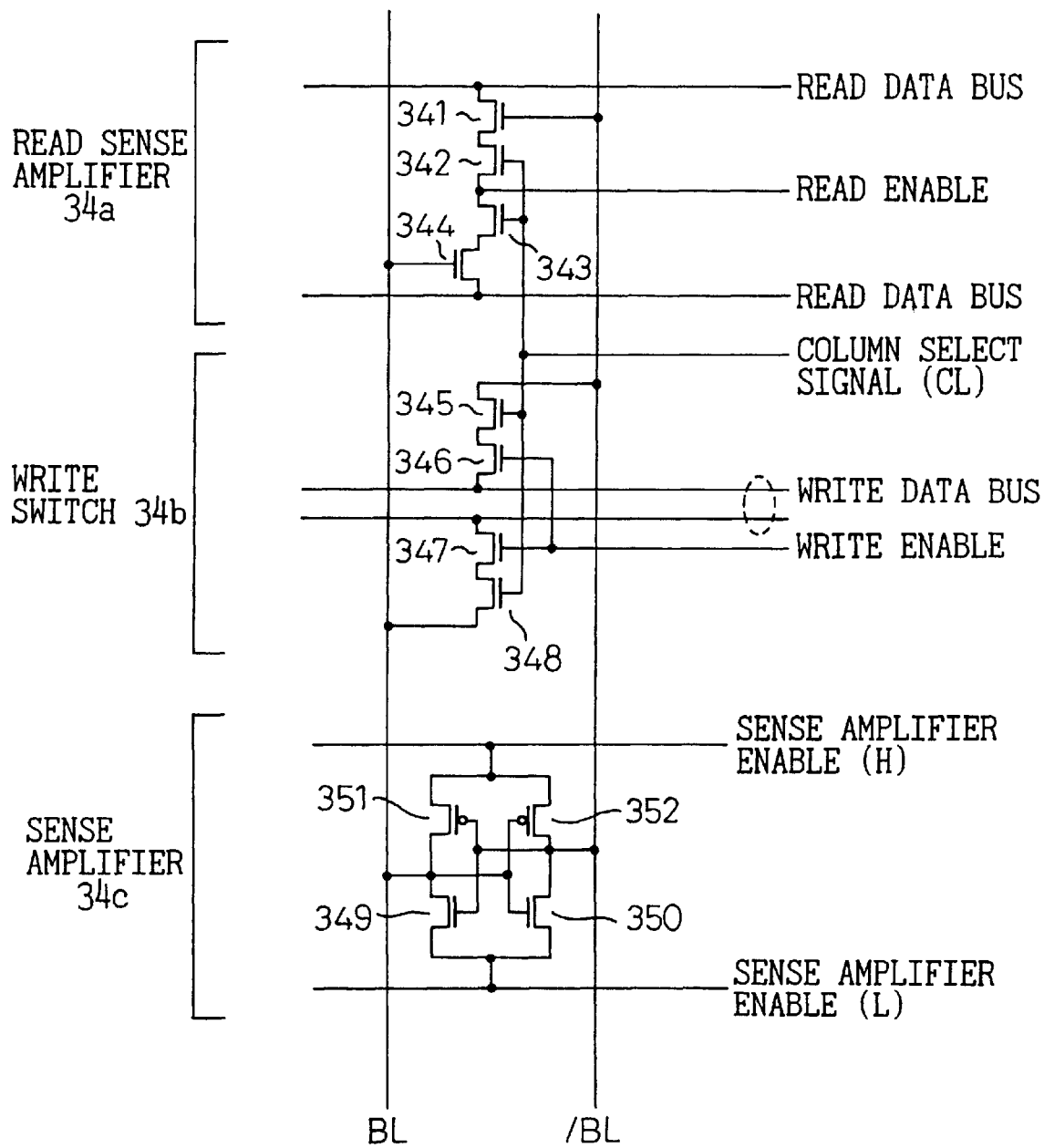
FIG. 9 is a circuit diagram showing one example of a sense amplifier/write switch used in the semiconductor memory device of the present invention.

FIG. 9 is a circuit diagram showing one example of the sense amplifier/write switch (34) used in the semiconductor memory device of the present invention. The sense amplifier/write switch 34 shown in FIG. 9 is of the so-called direct sense amplifier type applicable, for example, to memory devices such as SDRAMs that require high-speed operations.

As shown in FIG. 9, the sense amplifier/write switch 34 comprises p-channel MOS transistors (pMOS transistors) 341 to 350 and n-channel MOS transistors (nMOS transistors) 351 and 352.

The read sense amplifier 34a comprises the transistors 342 and 343 whose switching operations are controlled by a column select signal (CL) and the transistors 344 and 341 whose gates are connected to bit line BL and bit line /BL, respectively, and controls a current that flows from the read enable (signal) to the complementary read data buses in accordance with the levels of the complementary bit lines BL and /BL.

The write switch 34b comprises the transistors 346 and 347 whose switching operations are controlled by the write enable (signal) and the transistors 348 and 345 whose sources are connected to bit line BL and bit line /BL, respectively. The gates of the transistors 345 and 348 are supplied with the column select signal. When the column select signal and the write enable are both high "H", data on the complementary write data buses are written to the memory cell via the bit lines BL and /BL.

The sense amplifier 34c comprises the transistors 349 to 351, and amplifies the level difference between the complementary bit lines BL and /BL. Complementary sense amplifier enable signals are supplied to the sense amplifier to control the operation (activation) of the sense amplifier.

More specifically, the sense amplifier 34c amplifies the data output on the bit lines BL and /BL from the memory cell (32); in a read operation (READ), the read enable is set to a low level "L" (select state) and the column select signal CL to a high level "H" and the read data is transferred to the read data bus via the read sense amplifier 34a. At this time, the write enable is held at a low level "L" (deselect state).

In a write operation (WRITE), the write enable and the column select signal CL are both set to the high level "H" (select state) and the read enable is also set to the high level "H" (deselect state). By so doing, the information on the write data bus is transferred to the bit lines BL and /BL via the write switch 34b.

As shown in FIG. 9, in the sense amplifier/write switch 34 of the direct sense amplifier type, the read data bus and the write data bus are separated from each other within the memory cell array (32), so that the state of the write data bus does not affect the read data bus as long as the write enable is not selected. Further, since the number of data lines in the write data bus is equal to (or larger than) the number of bits in data that can be written in one write operation, the write data can be held on the write data bus. That is, if the write data is held on the write data bus (WRITE DB) through the write amplifier 6, the above-described first embodiment of the present invention can be applied.

Figure 10:
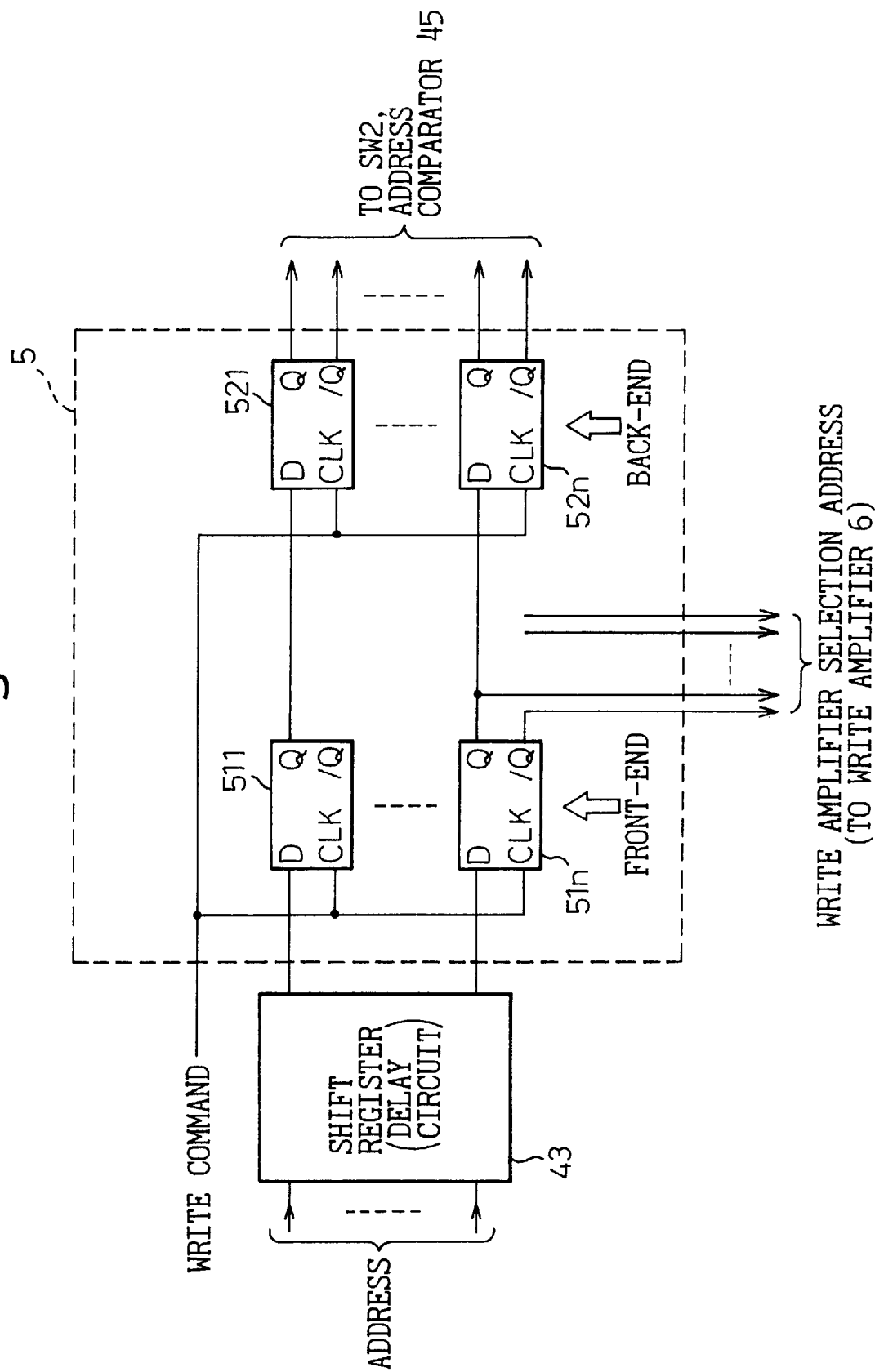
FIG. 10 is a circuit diagram showing one example of an address register used in the semiconductor memory device of the present invention.

FIG. 10 is a circuit diagram showing one example of the address register used in the semiconductor memory device of the present invention.

As shown in FIG. 10, the address register 5 comprises a plurality of front-end flip-flops 511 to 51n and a plurality of back-end flip-flops 521 to 52n, and holds the address (A0 to An) supplied via the shift register (delay circuit) 43. More specifically, the write command from the write command latch 42 is supplied to the clock terminal of each of the front-end and backend flip-flops 511 to 51n and 521 to 52n; when the write command (for example, WRITE B) is input, the address (ADDRESS-B) input together with the write command (WRITE B) is latched into the front-end flip-flops 511 to 51n for holding therein. The address (ADDRESS-B) held in the front-end flip-flops 511 to 51n is output as a write amplifier selection address to the write amplifier 6. The write amplifier selection address is a signal that designates the write amplifier where the write data (DB0, DB1) associated with the input write command (WRITE B) are to be held.

When the next write command (for example, WRITE C) is input, the address (ADDRESS-B) held in the front-end flip-flops 511 to 51n is transferred into the back-end flip-flops 521 to 52n and then supplied to the address comparator 44. At this time, the address (ADDRESS-C) associated with the input write command (WRITE C) is latched into the front-end flip-flops 511 to 51n in the same manner as described above.

The address comparator 44 judges (as described with reference to FIGS. 8A and 8B) whether the address associated with a read command, for example, matches the write address where data is to be written by the next write command.

Figure 11:
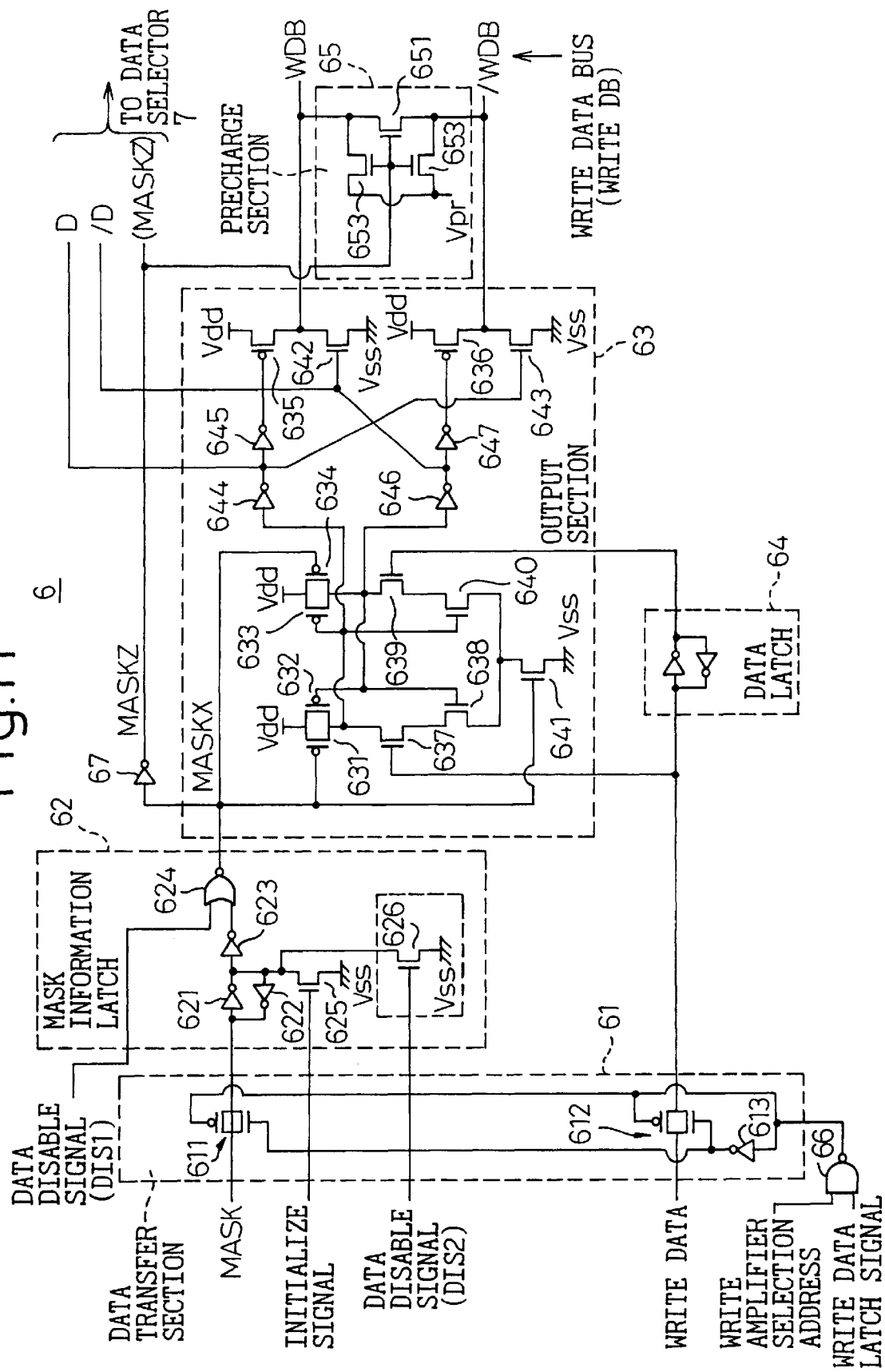
FIG. 11 is a circuit diagram showing one example of a write amplifier used in the semiconductor memory device of the present invention.

FIG. 11 is a circuit diagram showing one example of the write amplifier 6 used in the semiconductor memory device of the present invention.

As shown in FIG. 11, the write amplifier 6 comprises a data transfer section 61, a mask information latch section 62, an output section 63, a data latch 64 constructed with two inverters, a precharge section 65, a NAND gate 66, and an inverter 67. As previously described with reference to FIGS. 5A and 5B, the write data and the mask signal (MASK) are supplied to the write amplifier 6 and held on the write data bus (WRITE DB: WDB, /WDB).

As shown in FIG. 11, the data transfer section 61 comprises transfer gates 611 and 612 constructed with pMOS and nMOS transistors, and an inverter 613, and the transfer gates 611 and 612 are controlled by the output of the NAND gate 66 whose inputs are supplied with the write amplifier selection address from the address register 6 described above (the front-end flip-flops 511 to 51n) and the write data latch signal from the control circuit 21. More specifically, when the write amplifier selection address and the write data latch signal are both high "H", the write data and the mask signal MASK are supplied to the data latch 64 and the mask information latch 62, respectively, and held (latched) therein.

The mask information latch 62 comprises inverters 621 to 623, a NOR gate 624, and nMOS transistors 625 and 626. Here, the inverters 621 and 622 form a latch which latches the mask signal MASK transferred from the data transfer section 61. The output of the latch (621, 622) is inverted by the inverter 623 and input to the NOR gate 624 for NORing with the data disable signal (DIS1) input from the control circuit 21, and the result of the NORing is supplied as a new mask signal MASKX to the output section 63. An initialize signal is applied to the gate of the transistor 625 so that a pulse of high level "H" is output at power on, for example, in order to disable the data in the write amplifier 6. The transistor 626 disposed in parallel with the transistor 625 is not needed in the above-described first embodiment or in the second and third embodiments described hereinafter, but is needed only in the fourth embodiment described later, and the other data disable signal (DIS2) is supplied to the gate of the transistor 626. The data disable signal DIS1, which is normally held at a low level "H", will be described in detail later. The data disable signal DIS2 will be described in detail later in connection with the fourth embodiment.

In the SDRAM, for example, when a refresh command (an intensive refresh command) is supplied as a signal partly common to a write command, that is, when the specification is such that a command is supplied in serial segments and it is not possible, partway through the command, to distinguish whether the command is a refresh command or a write command (the code is the same up to an intermediate point for both commands), if, for example, the write operation of the data held in the write amplifier 6 is done, the write data may be disabled after the data has been written. That is, since a read command cannot be input during a refresh operation, there will be no problem if the write operation is done. In view of this, provisions may also be made to output the data disable signal (DIS1, DIS2) after the refresh operation is done.

The output section 63 comprises pMOS transistors 631 to 636, nMOS transistors 637 to 643, and inverters 644 to 647. The mask signal MASKX from the mask information latch 62 is supplied to the gates of the transistors 631, 634, and 641, while the complementary data held in the data latch 64 are applied to the gates of the transistors 637 and 639, respectively. The mask signal MASKX is inverted by the inverter 67 and supplied as a mask signal MASKZ to the precharge section 65 as well as to the data selector 7. The write data (write data information D, /D) to be supplied to the data selector 7 are taken from the outputs of the inverters 644 and 646. It will be noted here that the precharge section 65 need not necessarily be provided.

Outputs of the output section 63 are taken from an interconnection node between the transistors 635 and 642 and an interconnection node between the transistors 636 and 643, each transistor pair being provided between a high voltage power supply Vdd and a low voltage power supply Vss, and the held data appear on the write data buses (WDB and /WDB). More specifically, if the write data are masked by the mask signal MASK (MASK=high level "H"), MASKX is low "L", causing the four output transistors (635, 642; 636, 643) to turn off and thus placing the write data buses WDB and /WDB in an open condition. Here, if the precharge section 65 is provided, when the mask signal MASK (MASKZ) is high "H", nMOS transistors 651 to 653 in the precharge section 65 are all ON and, as a result, the write data buses WDB and /WDB are short-circuited and precharged to a precharge voltage Vpr (for example, an intermediate level of the supply voltage, i.e., Vdd/2).

Accordingly, when the mask signal MASK is high "H", that is, when the write data are to be masked, the write data buses WDB and /WDB are both placed in an open condition or held at the same voltage level (Vpr); as a result, if the write switch (34b: transistors 345 to 348) is activated for a write operation, writing to the memory cell (32) is not done since the sense amplifier cannot be inverted.

As described above, the write amplifier 6 supplies the write data information D, /D (and the mask signal MASKZ) held therein to the data selector 7; here, if the write data are masked, then the write data information D=/D=low level "L". If the state, write data information D=/D=low level "L", is detected, the data selector 7 recognizes the write data as being masked.

In the circuit example shown in FIG. 11, the signals (D and /D) to be supplied to the data selector 7 are generated independently of the write data buses (WDB and /WDB), but instead, the write data buses WDB and /WDB may be connected directly to the data selector 7. Further, the mask signal MASKZ, for example, can also be used to disable the write data.

The data disable signal DIS1 is issued to forcibly disable the data held on the write data buses, WDB and /WDB during a refresh operation. Here, the write data and the mask information are held in the respective latches (64 and 62) in the write amplifier 6. Refreshing must be done to each DRAM cell (memory cell 32), but the write data held in the latch 64 in the write amplifier 6 need not be refreshed since it is held in static fashion. Accordingly, during refreshing, the data disable signal DIS1 is held at the high level "H" to disable the data held on the write data buses WDB and /WDB so that the data will have no effect on the memory core (memory cell 32) being refreshed. After the refreshing is done, the data disable signal DIS1 is set to the low level "L" to restore the data on the write data buses WDB and /WDB in accordance with the write data and mask information held in the respective latches 64 and 62. Alternatively, provisions may be made to first write the data held on the write data buses WDB and /WDB into the memory cell (32) when a refresh operation is started. In this case also, it is preferable that after the write, the data disable signal DIS1 is issued to disable the data to prevent an unnecessary data write.

Figure 12:
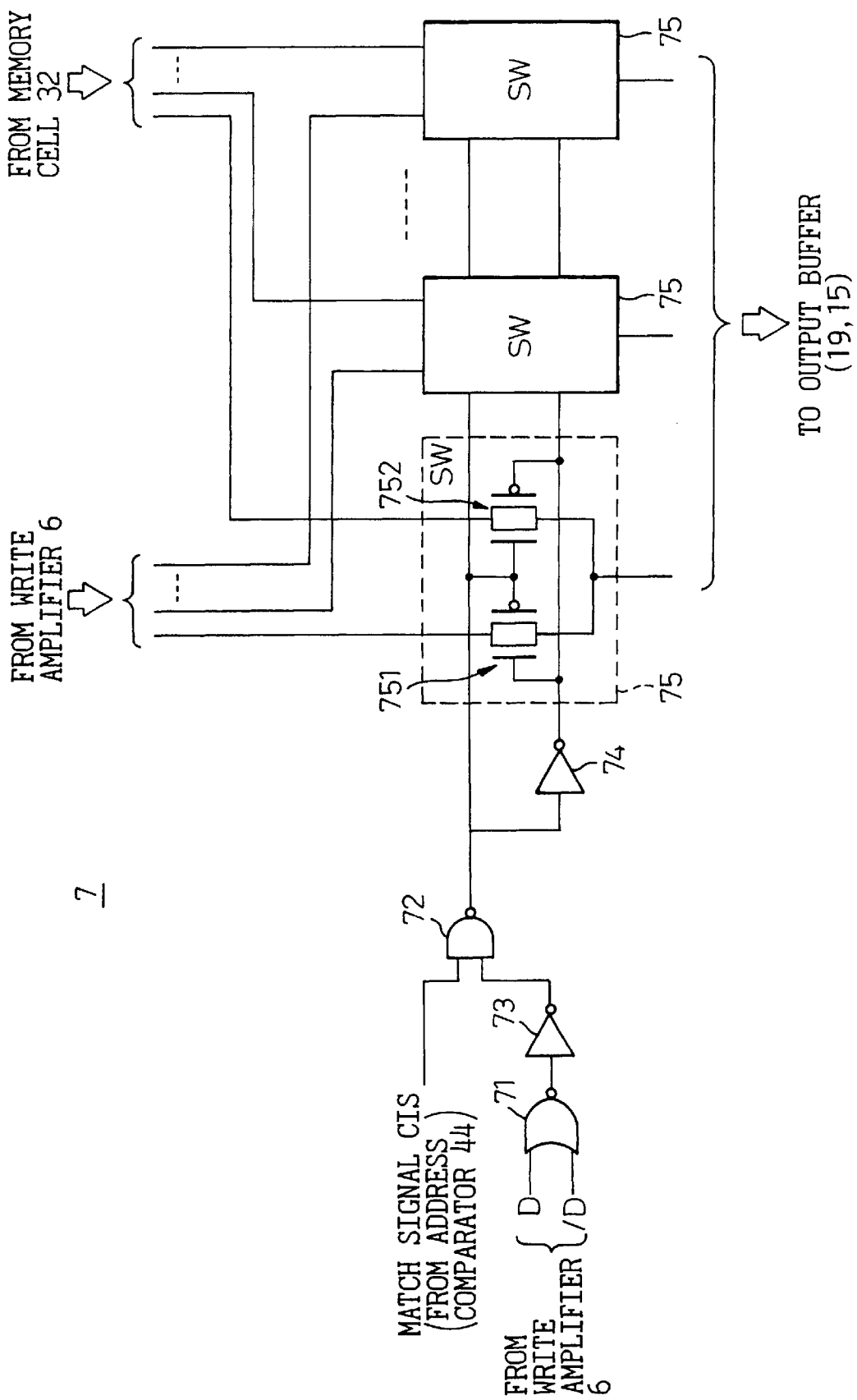
FIG. 12 is a circuit diagram showing one example of a data selector used in the semiconductor memory device of the present invention.

FIG. 12 is a circuit diagram showing one example of the data selector 7 used in the semiconductor memory device of the present invention.

As shown in FIG. 12, the data selector 7 comprises a NOR gate 71, a NAND gate 72, inverters 73 and 74, and a plurality of switches 75. The NAND gate 71 is supplied with the write data information D and /D from the write amplifier 6 described above and, when the data information D=/D= low level "L", outputs a high level "H", thereby detecting that the write data is disabled (masked). According, when the write data is masked, a low level "L" signal is input to the NAND gate 72 via the inverter 73. The other input of the NAND gate 72 is supplied with the match signal CIS from the address comparator 44. The match signal CIS is a signal that goes to the high level "H" in the event of an address match, that is, when the address of the write data held in the write amplifier 6 matches the read address. Accordingly, when the write data is not masked (the output of the inverter 73 is at the high level "H") and when the address of the write data held in the write amplifier 6 matches the read address (the match signal CIS is at the high level "H"), then the NAND gate 72 outputs a low level "L" signal and, hence, the output signal of the inverter 74 is at the high level "H".

Each switch 75 includes transfer gates 751 and 752 constructed with pMOS and nMOS transistors, and selects the data (write data) held in the write amplifier 6 or the read data from the memory cell 32 (memory core), respectively, for output to the output buffer (the parallel-serial converter 19 and the data I/O buffer register 15). That is, when the address of the write data held in the write amplifier 6 matches the read address, and when the write data is not masked, then the write data held in the write amplifier 6 is directly output as the read data. On the other hand, when the address of the write data held in the write amplifier 6 does not match the read address, and/or when the write data is masked, then the read data from the memory cell (32) is selected for output.

In the circuit example of the data selector shown in FIG. 12, the data information D, /D is input to the NAND gate 71 to detect whether the write data is masked or not, but instead, this may be done by directly using the mask signal (MASKZ).

Figure 13:
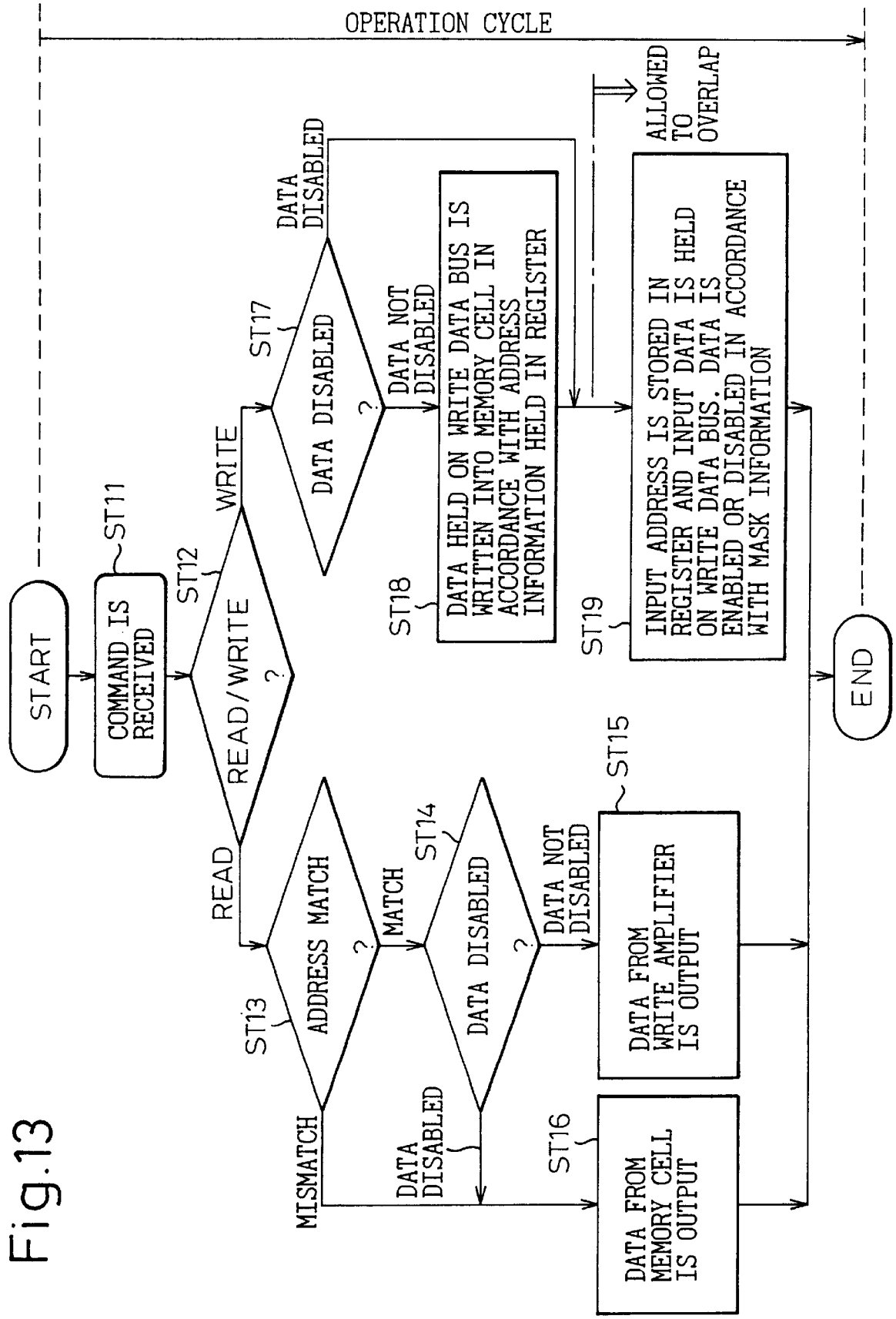
FIG. 13 is a flowchart for explaining operation cycles in the first embodiment of the semiconductor memory device according to the present invention.

FIG. 13 is a flowchart for explaining operation cycles in the first embodiment of the semiconductor memory device according to the present invention.

As shown in FIG. 13, when the operation of the semiconductor memory device of the first embodiment starts, first an externally supplied command is received in step ST11, and in the next step ST12 it is determined whether the command is a read command (READ) or a write command (WRITE). If the externally supplied command is a read command (READ), the process proceeds to step ST13 where a comparison is made in the comparator 44 to determine whether the address specified by the read command matches the address of the write data held in the write amplifier (6). If it is determined in step ST13 that the addresses match (the match signal CIS is at a high level "H"), the process proceeds to step ST14 to determine whether the data is disabled or not (that is, whether the write data is masked or not); if the data is not disabled (the write data is not masked, that is, the mask signal MASK is at a low level "L"), the process proceeds to step ST15 and the data (write data) held in the write amplifier 6 is output as the data (read data) supposed to be read from the address specified by the read command.

On the other hand, if it is determined in step ST13 that the address specified by the read command does not match the address of the write data held in the write amplifier (6), or if it is determined in step ST14 that the data is disabled (the write data is masked), then the data held in the write amplifier 6 is not selected, but the data actually read from the memory cell (32) is output as the read data requested by the read command.

Turning back to step ST12, if it is determined that the externally supplied command is a write command (WRITE), the process proceeds to step ST17 to determine whether the data is disabled or not (that is, whether the write data is masked or not). If it is determined that the data is not disabled (the write data is not masked), then in step ST18 the data held on the write data bus WDB, /WDB (the write data latched in the write amplifier 6) is written into the memory cell (32) in accordance with the address information (the address associated with the previous write command) held in the address register 5, after which the process proceeds to step ST19.

On the other hand, if it is determined in step ST17 that the data is disabled (the write data is masked), the process proceeds to step ST19. In step ST19, the input address (the write address of the current write data) is stored (held) in the address register 5, and the input data (the current write data) is held on the write data bus WDB, /WDB. Further, in step ST19, the write data is disabled or enabled (masked or unmasked) in accordance with the mask information (mask signal MASK).

Figure 14:
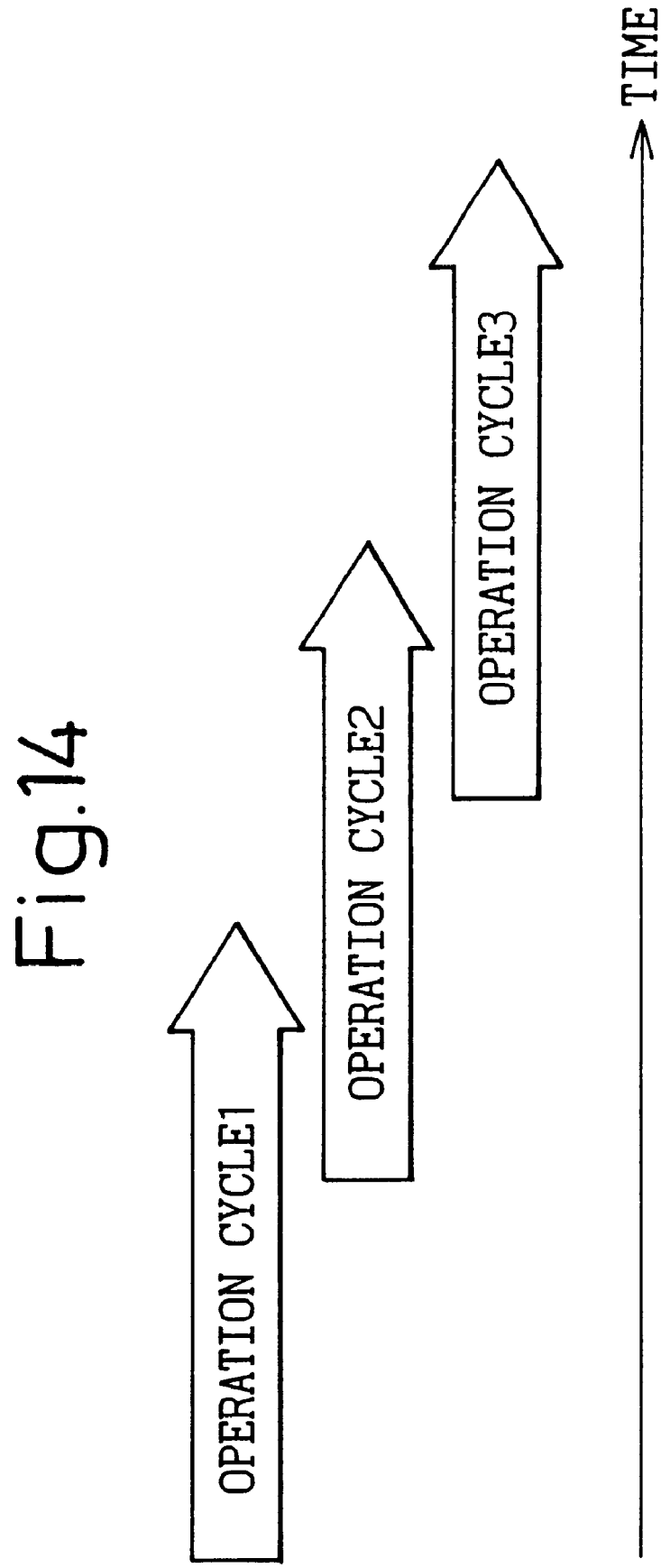
FIG. 14 is a diagram for explaining the operation cycles of the semiconductor memory device shown in FIG. 13.

FIG. 14 is a diagram for explaining the operation cycles of the semiconductor memory device shown in FIG. 13.

As shown in FIG. 14, the operation cycles in FIG. 13 are allowed to proceed partially overlapping with each other; for example, in the write operation (WRITE), step ST19 in the second half of the operation can be processed partially overlapping with step ST17 or step ST18 in the first half of the operation.

As described above, the semiconductor memory device of the present embodiment eliminates the need for an extra register (data register) for storing write data, and can thus suppress increases in chip area and cost. Furthermore, in the semiconductor memory device of the present embodiment, since the write data is transferred in advance up to the write data bus (WDB, /WDB), the data transfer time for the write data can be reduced, achieving faster operation.

Figure 15A:
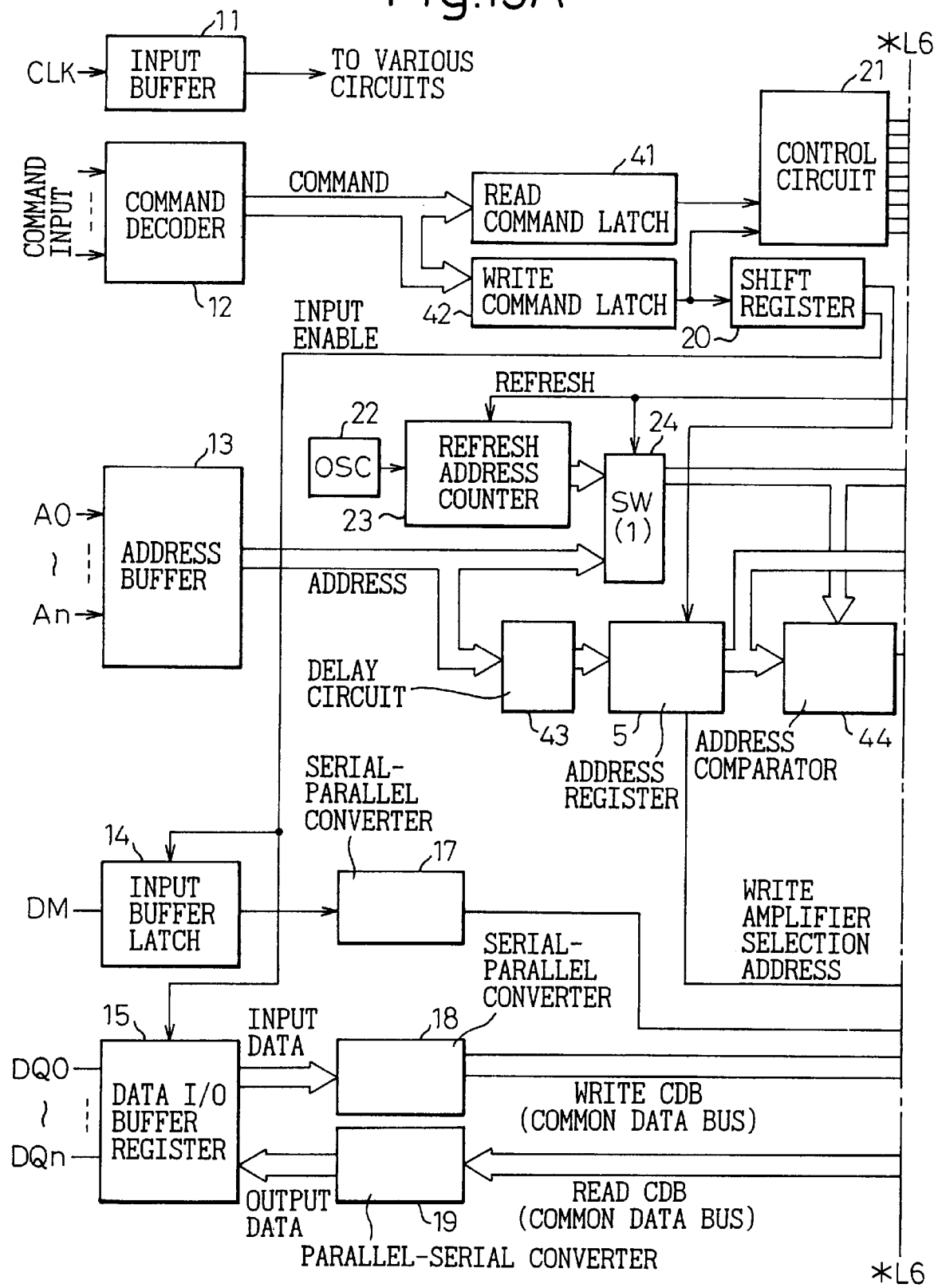
FIGS. 15A and 15B are block diagrams showing a second embodiment of a semiconductor memory device according to the present invention.
Figure 15B:
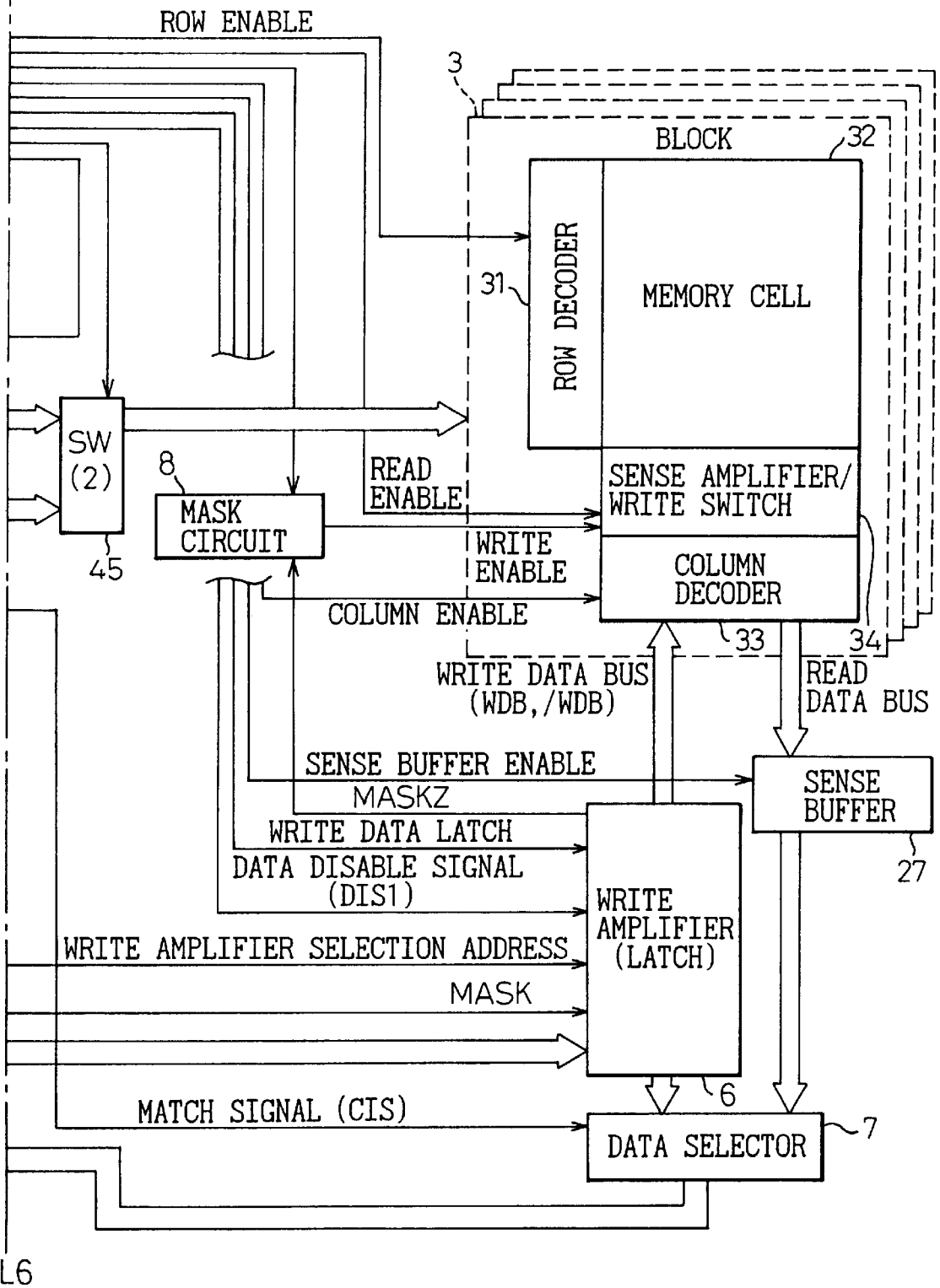

FIGS. 15A and 15B are block diagrams showing the second embodiment of the semiconductor memory device according to the present invention.

As can be seen from a comparison with the first embodiment shown in FIGS. 5A and 5B, the semiconductor memory device of the second embodiment shown in FIGS. 15A and 15B differs from the semiconductor memory device of the first embodiment by the inclusion of a mask circuit 8 which, when the mask signal (MASKZ) is at a high level "H" (that is, when the write data is masked), controls the write enable (that is, does not output the write enable) so that writing of the data will not be done.

More specifically, the mask circuit 8 is supplied not only with the mask signal MASKZ from the write amplifier 6, but also with the write enable from the control circuit 21 in the first embodiment and, using the write enable from the control circuit 21 and the mask signal MASKZ from the write amplifier 6, the mask circuit 8 controls the write operation in the sense amplifier/write switch 34. The second embodiment is preferable, for example, when the parasitic capacitance on the write data bus WDB, /WDB is high, and serves to ensure higher data integrity (by preventing erroneous writing of data). Furthermore, controlling the masking of write data by the write enable, as in the present embodiment, is preferable from the standpoint of achieving faster operation of the semiconductor memory device.

Figure 16A:
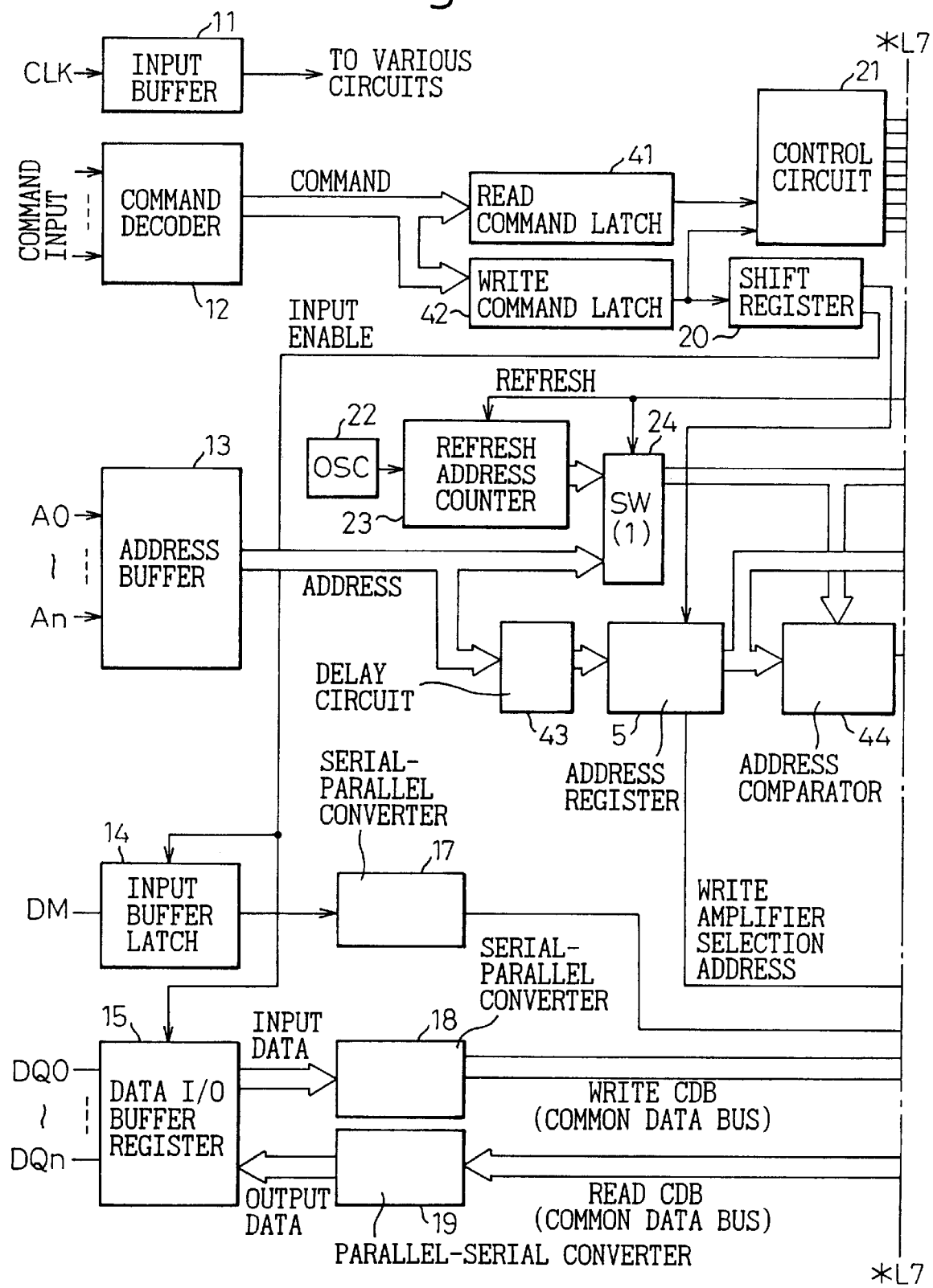
FIGS. 16A and 16B are block diagrams showing a third embodiment of a semiconductor memory device according to the present invention.
Figure 16B:
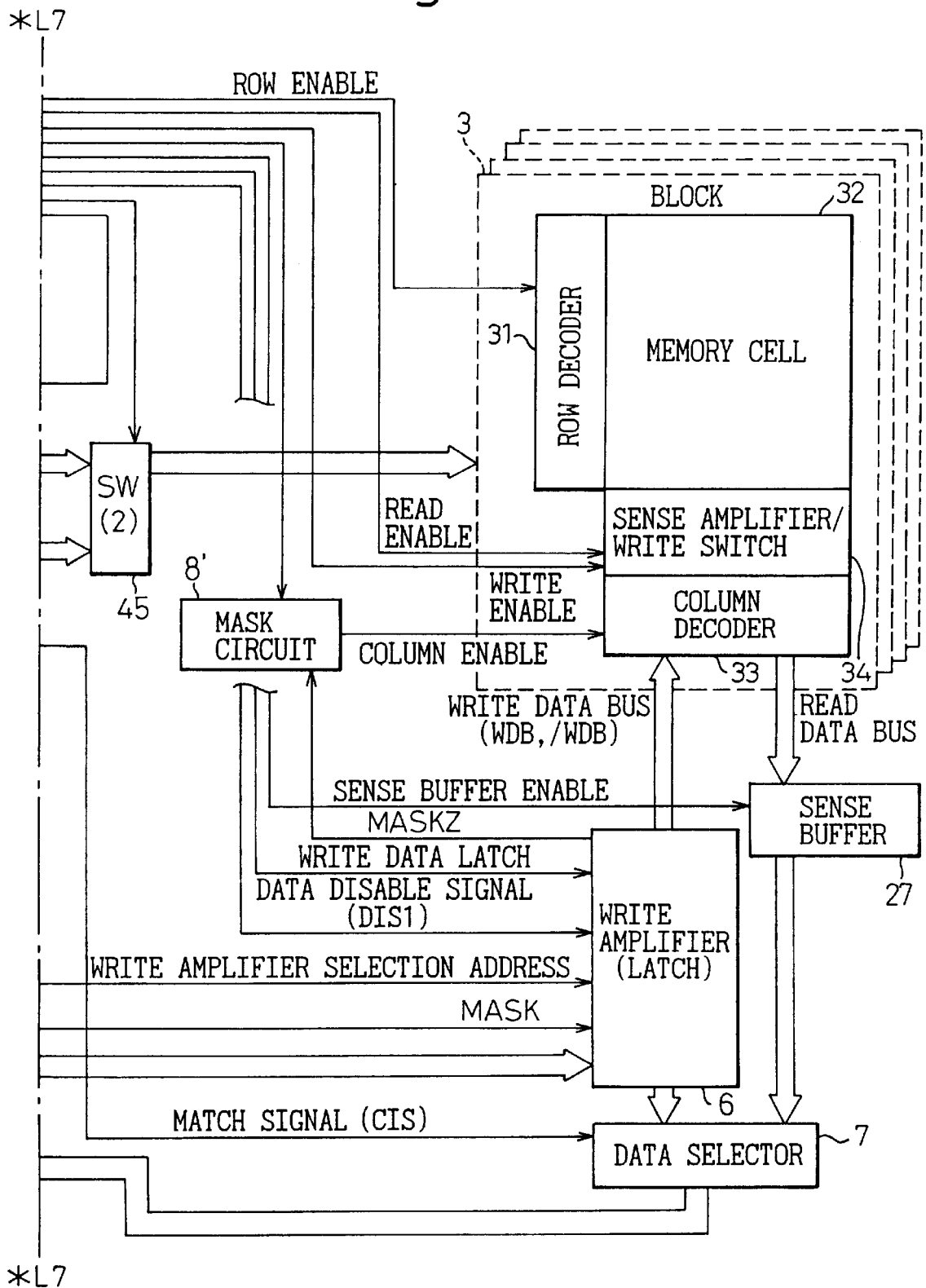

FIGS. 16A and 16B are block diagrams showing the third embodiment of the semiconductor memory device according to the present invention.

The semiconductor memory device of the third embodiment shown in FIGS. 16A and 16B includes a mask circuit 8' which is a modification of the mask circuit 8 in the second embodiment shown in FIGS. 15A and 15B. More specifically, the mask circuit 8' in the third embodiment is configured to control the column decoder 33 by using the mask signal MASKZ supplied from the write amplifier as well as the column enable supplied from the control circuit 21 in the first embodiment. More specifically, when the write data is masked (the mask signal MASKZ is at a high level "H"), the mask signal 8' does not output the column enable, as a result of which the write data buses WDB and /WDB are not connected to the bit lines BL and /BL. The third embodiment, as with the foregoing second embodiment, is preferable, for example, when the parasitic capacitance on the write data bus WDB, /WDB is high. The configuration of the second and third embodiments, other than the differences described above, is the same as that of the first embodiment, and the description will not be repeated here.

Figure 17A:
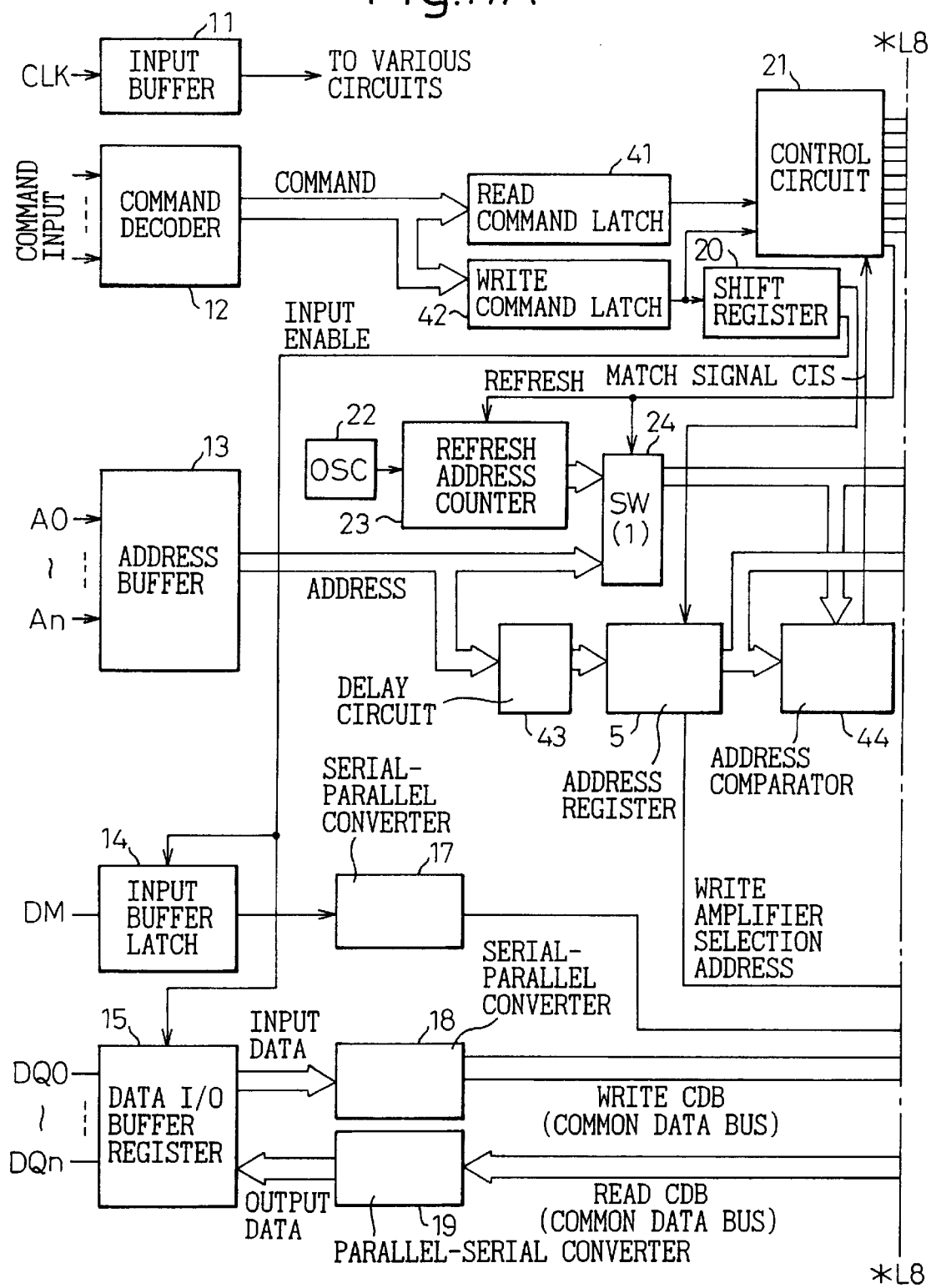
FIGS. 17A and 17B are block diagrams showing a fourth embodiment of a semiconductor memory device according to the present invention.
Figure 17B:
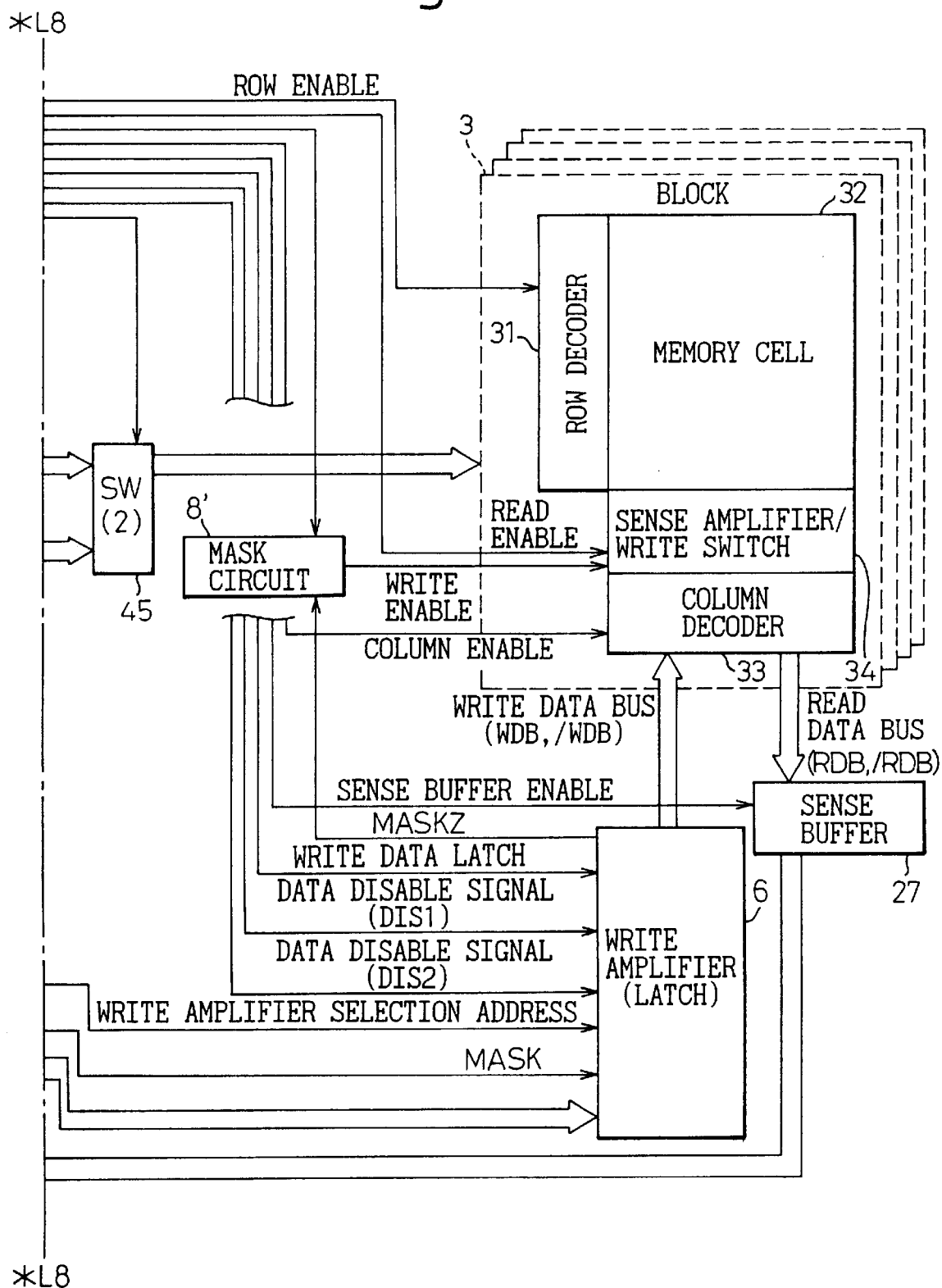
Figure 18A:
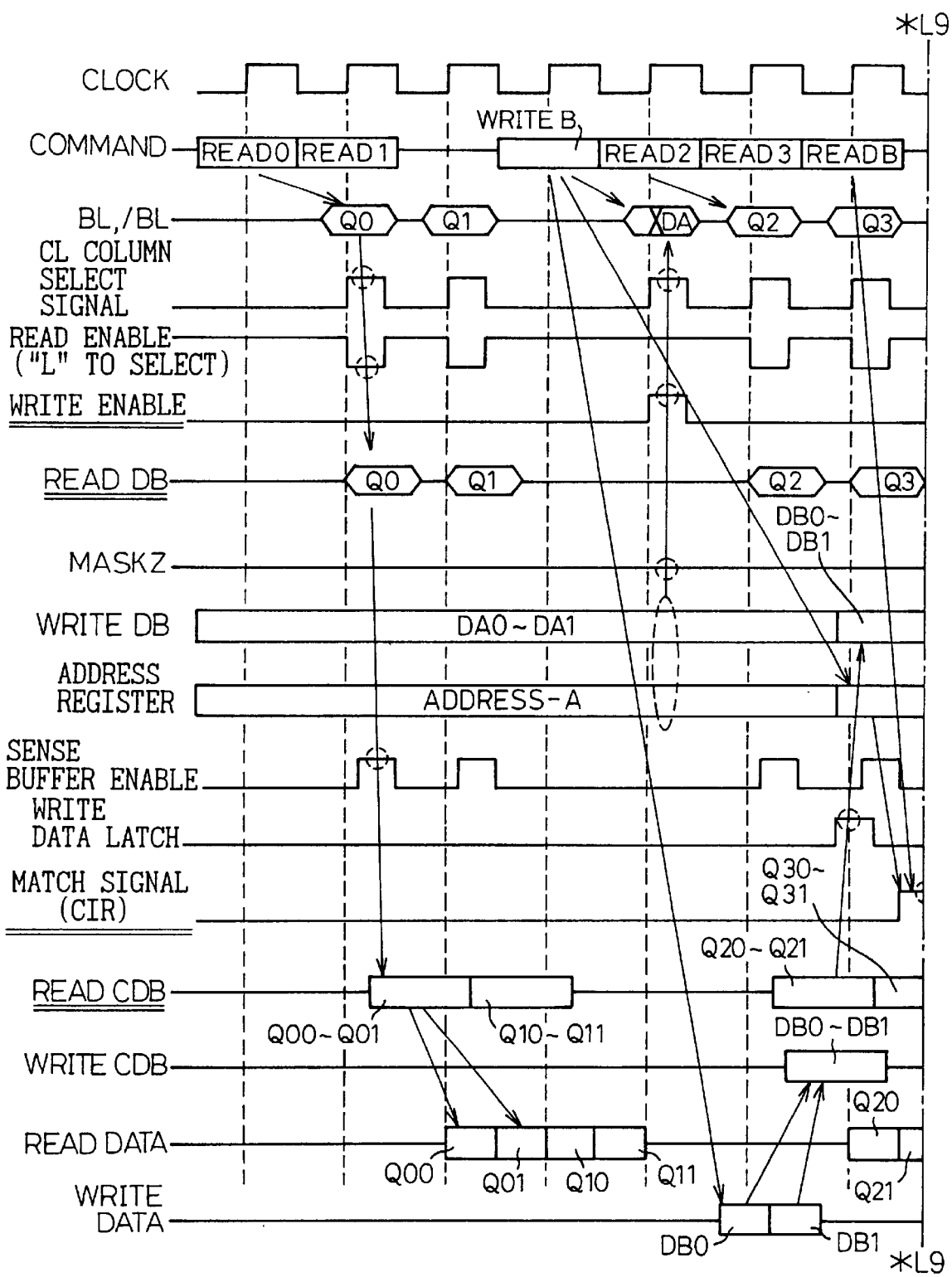
FIGS. 18A and 18B are timing diagrams for explaining one example of the operation of the fourth embodiment of the semiconductor memory device according to the present invention.
Figure 18B:
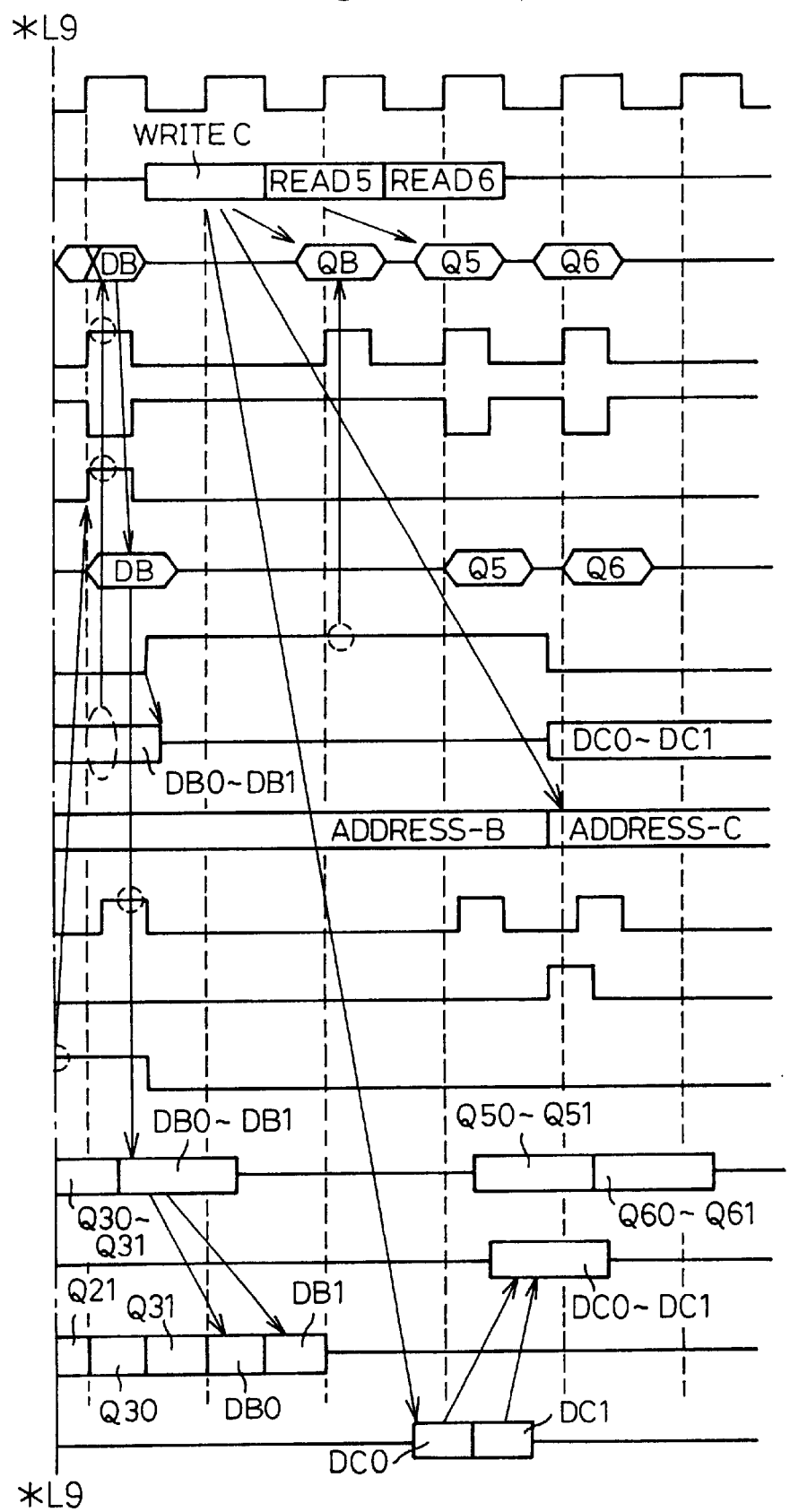

FIGS. 17A and 17B are block diagrams showing the fourth embodiment of the semiconductor memory device according to the present invention, and FIGS. 18A and 18B are timing diagrams for explaining one example of operation of the fourth embodiment of the semiconductor memory device according to the present invention.

The semiconductor memory device of the fourth embodiment shown in FIGS. 17A and 17B eliminates the need for the data selector 7 provided in the third embodiment shown in FIGS. 16A and 16B. In the fourth embodiment, the write amplifier 6 is also supplied with the second data disable signal (DIS2) from the control circuit 21.

More specifically, in the fourth embodiment, as can be seen from a comparison between FIGS. 18A, 18B and FIGS. 8A, 8B, when read commands READ2 and READ3 are input following the write command WRITE B and then a read command READ B (a read command for data at the same address as the address specified by the write command WRITE B) is input, the address comparator 44 generates a match signal CIS (a pulse of high level "H") and this match signal CIS is input to the control circuit 21. In response to the match signal CIS, the control circuit 21 outputs the write enable, which causes the data held in the write amplifier 6 to be transferred to the bit lines BL and /BL for writing into the memory cell 32. This write data (the data requested by the read command READ B) is also transferred to the read data bus RDB, /RDB and is output via the sense buffer 27, parallel-serial converter 19, and data I/O buffer register 15.

Accordingly, in the fourth embodiment, both the write enable and the read enable are output to simultaneously carry out the write and read operations to the memory cell. When the writing to the memory cell 32 is completed, the control circuit 21 generates the data disable signal DIS2 (pulse signal) to disable the data. Here, the data disable signal DIS2 is supplied, for example, to the gate of the transistor 626 in the mask information latch 62 of the write amplifier shown in FIG. 11, and the above-described data disabling (masking) operation is performed.

When the write data is masked, the mask circuit 8' does not output the write enable, as in the foregoing third embodiment. Further, when a write command WRITE C is input following the read command B, since the writing of the data held on the write data bus WDB, /WDB (the write amplifier 6) was done when the read command READ B was input, and since the write data is disabled, the write operation to the memory cell 32 is not performed.

Figure 19:
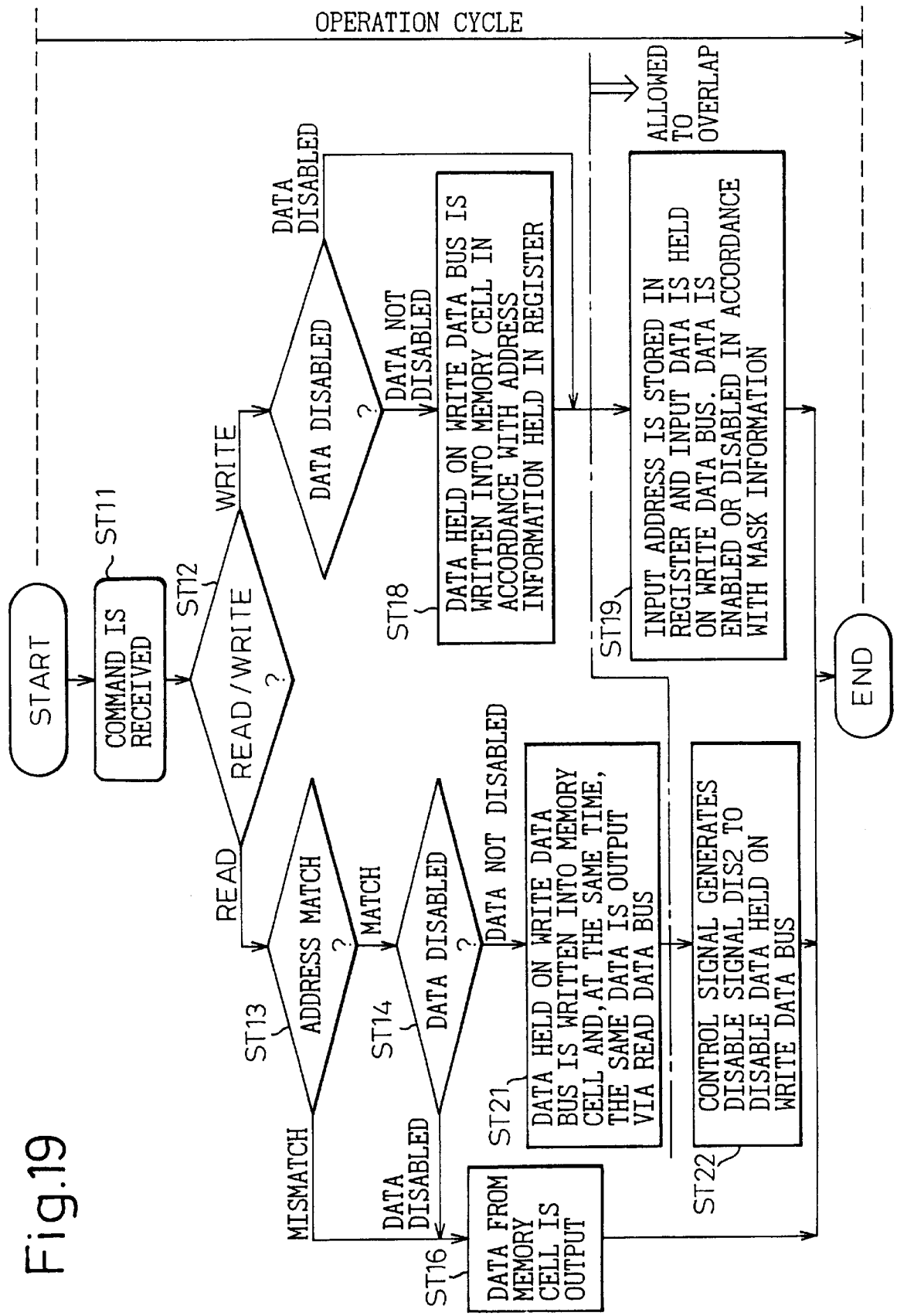
FIG. 19 is a flowchart for explaining operation cycles in the fourth embodiment of the semiconductor memory device according to the present invention.

FIG. 19 is a flowchart for explaining operation cycles in the fourth embodiment of the semiconductor memory device according to the present invention.

In the flowchart of FIG. 19, step ST15 shown in the flowchart of FIG. 13 is replaced by steps ST21 and ST22.

More specifically, if it is determined in step ST14 that the data is not disabled (the write data is not masked, that is, the mask signal MASK is at a low level "L"), the process proceeds to step ST21, and the data held on the write data bus WDB, /WDB (the write data latched in the write amplifier 6) is written into the memory cell (32), while at the same time, the same write data is latched into the sense buffer 27 via the read data bus RDB, /RDB and is output via the parallel-serial converter 19 and data I/O buffer register 15.

The process then proceeds to step ST22 where the data held on the write data bus WDB, /WDB is disabled in response to the data disable signal DIS2 from the control circuit 21. Here, the operation cycles in FIG. 19 are allowed to proceed partially overlapping with each other; for example, in the write operation (WRITE), step ST19 in the second half of the operation can be processed partially overlapping with step ST17 or step ST18 in the first half of the operation, and in the read operation (READ), step ST22 in the second half of the operation can be processed partially overlapping with step ST13, ST14, ST16, or ST21 in the first half of the operation. Other steps in FIG. 19 than those described above are the same as the corresponding steps in FIG. 13, and the description will not be repeated here.

In the above embodiments, the semiconductor memory device has been described as being an SDRAM, but the present invention is not limited to the SDRAM; for example, the present invention is also applicable to various other semiconductor memory devices such as DDR DRAMs, direct Rambus DRAMs, and even non-DRAM devices such as SRAMs.

As described in detail above, according to the present invention, a semiconductor memory device with improved data transfer rate can be realized without having to provide an extra register for holding write data and without involving increases in chip area or in cost. Furthermore, in the semiconductor memory device of the present invention, since write data is transferred in advance up to the write data bus, the data transfer time for the write data is reduced, achieving faster operation.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory device having a read data line and a write data line, comprising:

an address information holding circuit holding address information that is input in relation to write data, wherein when an access occurs to the address held in said address information holding circuit, data held on said write data line is written into a memory cell corresponding to the address;

a write amplifier outputting write data on said write data line, and holding said write data;

an address comparator comparing received address information with the address information held in said address information holding circuit;

a data selector selecting the data output from said memory cell or the data output from said write amplifier, based on the result of the comparison supplied from said address comparator, wherein said data selector selects the data output from said memory cell or the data output from said write amplifier, based on mask information indicating enable/disable of said write data.

2. A semiconductor memory device having a read data line and a write data line, comprising:

an address information holding circuit holding address information that is input in relation to write data, wherein when an access occurs to the address held in said address information holding circuit, data held on said write data line is written into a memory cell corresponding to the address;

a write amplifier outputting write data on said write data line, and holding said write data; and an address comparator comparing received address information with the address information held in said address information holding circuit wherein, based on the result of the comparison supplied from said address comparator, the data held on said write data line is written into said memory cell, and wherein, based on the result of the comparison supplied from said address comparator, the data held on said write data line is written into said memory cell, while at the same time, said data is transferred onto said read data line.

\* \* \* \* \*